(12) United States Patent
Jinta et al.

(10) Patent No.: US 10,439,006 B2
(45) Date of Patent: Oct. 8, 2019

(54) CONTROLLING LUMINANCE OF A DISPLAY UNIT

(71) Applicant: SONY CORPORATION, Tokyo (JP)

(72) Inventors: Seiichiro Jinta, Kanagawa (JP); Jiro Yamada, Kanagawa (JP); Shuji Kudo, Kanagawa (JP); Shigeyuki Matsunami, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/892,704

(22) PCT Filed: Mar. 26, 2014

(86) PCT No.: PCT/JP2014/058657
§ 371 (c)(1),
(2) Date: Nov. 20, 2015

(87) PCT Pub. No.: WO2014/192396
PCT Pub. Date: Dec. 4, 2014

(65) Prior Publication Data
US 2016/0104750 A1  Apr. 14, 2016

(30) Foreign Application Priority Data

May 28, 2013 (JP) ................. 2013-112074
Oct. 30, 2013 (JP) ................. 2013-225534

(51) Int. Cl.
*H01L 27/32* (2006.01)
*H01L 51/52* (2006.01)

(52) U.S. Cl.
CPC ...... *H01L 27/3216* (2013.01); *H01L 27/3213* (2013.01); *H01L 27/3218* (2013.01); *H01L 27/3246* (2013.01); *H01L 51/5271* (2013.01)

(58) Field of Classification Search
CPC .......... H01L 51/5209; H01L 51/5225; H01L 51/5271; H01L 27/3213; H01L 27/3216; H01L 27/3218
(Continued)

(56) References Cited

U.S. PATENT DOCUMENTS 8,723,168 B2 * 5/2014 Ando ............... H01L 51/56
257/40
8,952,374 B2 * 2/2015 Jinta ............... H01L 27/3218
257/40
(Continued)

FOREIGN PATENT DOCUMENTS

CN  1992373 A  7/2007
CN  104103667 A  10/2014
(Continued)

OTHER PUBLICATIONS

Machine translation, Imai, Japanese Pat. Pub. No. JP 2011-34849, translation date: Apr. 29, 2017, Espacenet, all pages.*
(Continued)

*Primary Examiner* — Victoria K. Hall
(74) *Attorney, Agent, or Firm* — Chip Law Group

(57) ABSTRACT

There is provided an apparatus configured to control a display section of a display unit. There is included a pixel in the display section including a plurality of sub-pixels, each of the sub-pixels including a single first electrode, a single second electrode provided along a laminating direction of the first electrode, and a light-emitting layer inserted between the first electrode and the second electrode. One or more of the plurality of sub-pixels have a plurality of window openings that include at least two or more window openings different in one or more of shape, size, and orientation from one another.

21 Claims, 31 Drawing Sheets

(58) Field of Classification Search
USPC .............................................. 257/40, 98, 99
See application file for complete search history.

(56) References Cited

U.S. PATENT DOCUMENTS

| | | | | |
|---|---|---|---|---|
| 9,117,403 B2* | 8/2015 | Omoto | ............... | H01L 51/5225 |
| 9,224,334 B2* | 12/2015 | Izumi | ............... | G09G 3/2003 |
| 9,287,333 B2* | 3/2016 | Jinta | ............... | H01L 27/3218 |
| 10,068,952 B2* | 9/2018 | Teramoto | ............ | H01L 27/3246 |
| 10,312,314 B2* | 6/2019 | Jinta | ............... | H01L 51/504 |
| 10,334,692 B2* | 6/2019 | Kikuchi | ............... | H05B 33/22 |
| 2006/0170712 A1* | 8/2006 | Miller | ............... | H01L 27/3211 |
| | | | | 345/695 |
| 2008/0054785 A1* | 3/2008 | Hayashi | ............... | B29C 65/14 |
| | | | | 313/483 |
| 2008/0122347 A1* | 5/2008 | Lee | ............... | H01L 27/3244 |
| | | | | 313/504 |
| 2008/0122754 A1* | 5/2008 | Sacher | ............... | G09F 9/372 |
| | | | | 345/72 |
| 2008/0146689 A1* | 6/2008 | Oyanagi | ............... | C09D 11/101 |
| | | | | 522/39 |
| 2008/0237650 A1* | 10/2008 | Malliaras | ............... | B82Y 20/00 |
| | | | | 257/214 |
| 2009/0115326 A1* | 5/2009 | Chan | ............... | H01L 51/5265 |
| | | | | 313/504 |
| 2010/0060148 A1* | 3/2010 | Hwang | ............... | H01L 27/3213 |
| | | | | 313/504 |
| 2011/0101386 A1* | 5/2011 | Fukuda | ............... | H01L 51/5271 |
| | | | | 257/89 |
| 2012/0056231 A1* | 3/2012 | Boerner | ............... | H01L 51/5271 |
| | | | | 257/98 |
| 2012/0199856 A1* | 8/2012 | Koresawa | ............... | G02B 5/201 |
| | | | | 257/89 |
| 2012/0268004 A1* | 10/2012 | Choi | ............... | H01L 51/52 |
| | | | | 313/504 |
| 2013/0057456 A1* | 3/2013 | Omoto | ............... | H01L 51/5225 |
| | | | | 345/76 |
| 2013/0069046 A1* | 3/2013 | Ishizuya | ............... | H01L 51/5271 |
| | | | | 257/40 |
| 2014/0014938 A1* | 1/2014 | Harai | ............... | H01L 51/5262 |
| | | | | 257/40 |
| 2014/0027753 A1* | 1/2014 | Yamana | ............... | H01L 51/5209 |
| | | | | 257/40 |
| 2014/0151651 A1* | 6/2014 | Jin | ............... | H01L 51/5209 |
| | | | | 257/40 |
| 2014/0203258 A1* | 7/2014 | Guo | ............... | H01L 51/5268 |
| | | | | 257/40 |
| 2014/0217372 A1* | 8/2014 | Shim | ............... | H01L 51/5012 |
| | | | | 257/40 |
| 2014/0284570 A1* | 9/2014 | Jinta | ............... | H01L 27/3218 |
| | | | | 257/40 |
| 2014/0285542 A1* | 9/2014 | Izumi | ............... | G09G 3/2003 |
| | | | | 345/694 |
| 2014/0306200 A1* | 10/2014 | Jinta | ............... | H01L 27/3218 |
| | | | | 257/40 |
| 2014/0339514 A1* | 11/2014 | Oh | ............... | H01L 51/5209 |
| | | | | 257/40 |
| 2014/0346449 A1* | 11/2014 | Choi | ............... | H01L 27/3211 |
| | | | | 257/40 |
| 2015/0034925 A1* | 2/2015 | Shinotsuka | ............... | H01L 51/5218 |
| | | | | 257/40 |
| 2015/0115251 A1* | 4/2015 | Jinta | ............... | H01L 51/5234 |
| | | | | 257/40 |
| 2015/0138463 A1* | 5/2015 | Jinta | ............... | H01L 51/5218 |
| | | | | 349/33 |
| 2015/0162494 A1* | 6/2015 | Imai | ............... | H01L 51/5012 |
| | | | | 257/99 |
| 2015/0188088 A1* | 7/2015 | Kubota | ............... | H01L 51/5268 |
| | | | | 257/40 |
| 2015/0221893 A1* | 8/2015 | Teraguchi | ............... | H01L 51/5271 |
| | | | | 257/40 |
| 2015/0332626 A1* | 11/2015 | Toyomura | ............... | G09G 3/30 |
| | | | | 345/80 |
| 2019/0189715 A1* | 6/2019 | Nendai | ............... | H01L 27/3246 |

FOREIGN PATENT DOCUMENTS

| | | | | | |
|---|---|---|---|---|---|
| JP | 2003-272872 A | | 9/2003 | | |
| JP | 2003272872 A | * | 9/2003 | ............ | H05B 33/22 |
| JP | 2006-59864 | * | 3/2006 | ............ | H01L 33/00 |
| JP | 2006-059864 A | | 3/2006 | | |
| JP | 2006-164864 | * | 6/2006 | ............ | H05B 33/22 |
| JP | 2006-164864 A | | 6/2006 | | |
| JP | 2006164864 A | * | 6/2006 | ............ | H05B 33/22 |
| JP | 2007-184290 A | | 7/2007 | | |
| JP | 2011-34849 | * | 2/2011 | ............ | H05B 33/12 |
| JP | 2011-034849 A | | 2/2011 | | |
| JP | 2013-058324 A | | 3/2013 | | |
| JP | 2013-102154 A | | 5/2013 | | |

OTHER PUBLICATIONS

Machine translation, Baba, Japanese Pat. Pub. No. JP 2006-59864, translation date: Apr. 29, 2017, Espacenet, all pages.*
Machine translation, Kihara, Japanese Pat. Pub. No. 2003-272872, translation date: Apr. 29, 2017, Espacenet, all pages.*
Machine translation, Ito, Japanese Pat. Pub. No. JP 2006-164864, translation date: Sep. 27, 2018, Espacenet, all pages.*
Office Action for CN Patent Application No. 201480029224.3, dated Nov. 15, 2016, 10 pages of Office Action and 17 pages of English Translation.
Office Action for CN Patent Application No. 201480029224.3, dated Jul. 19, 2017, 10 pages of Office Action and 22 pages of English Translation.
Office Action for JP Patent Application No. 2015-519715, dated Jan. 9, 2018, 07 pages of Office Action and 04 pages of English Translation.

* cited by examiner

[ FIG. 1 ]
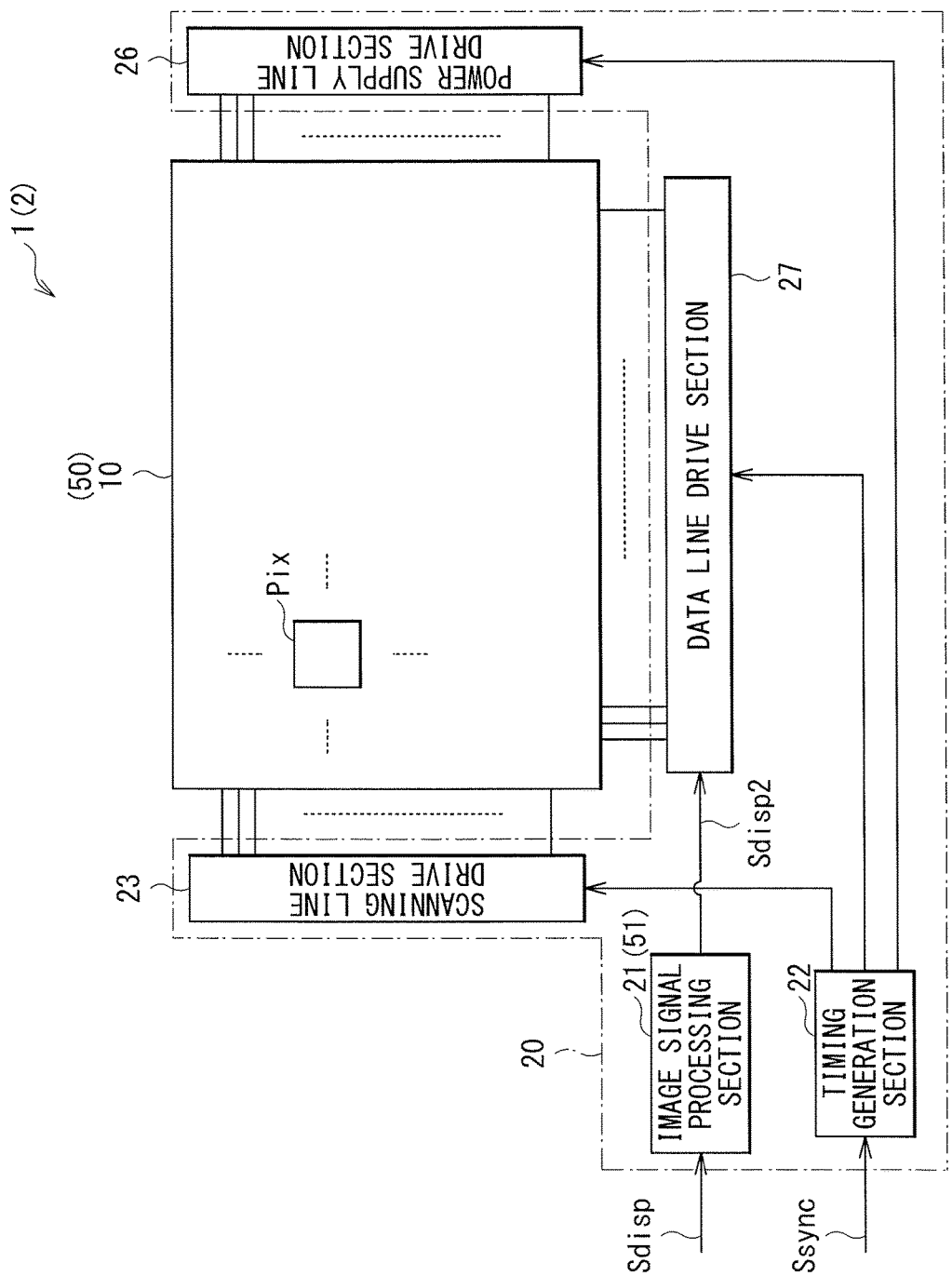

[ FIG. 2 ]
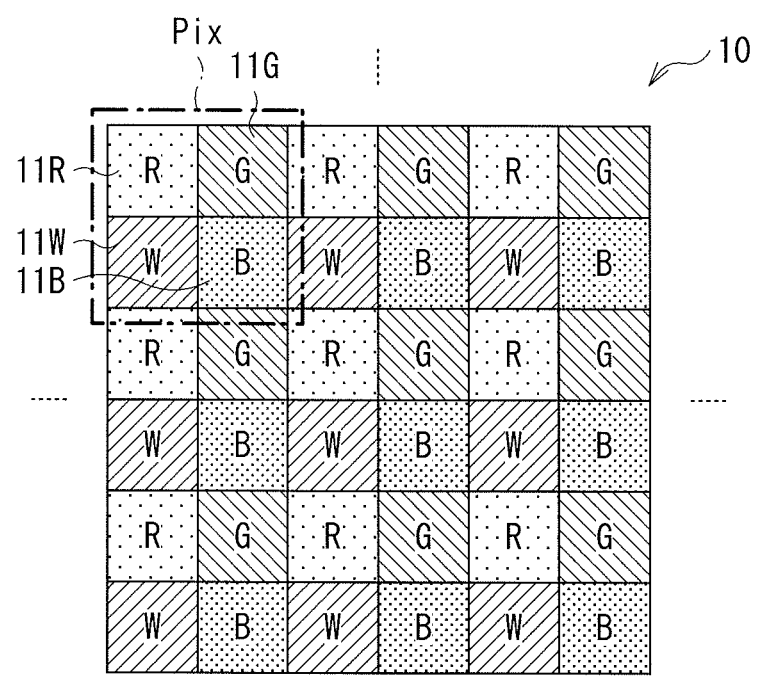

[ FIG. 3 ]
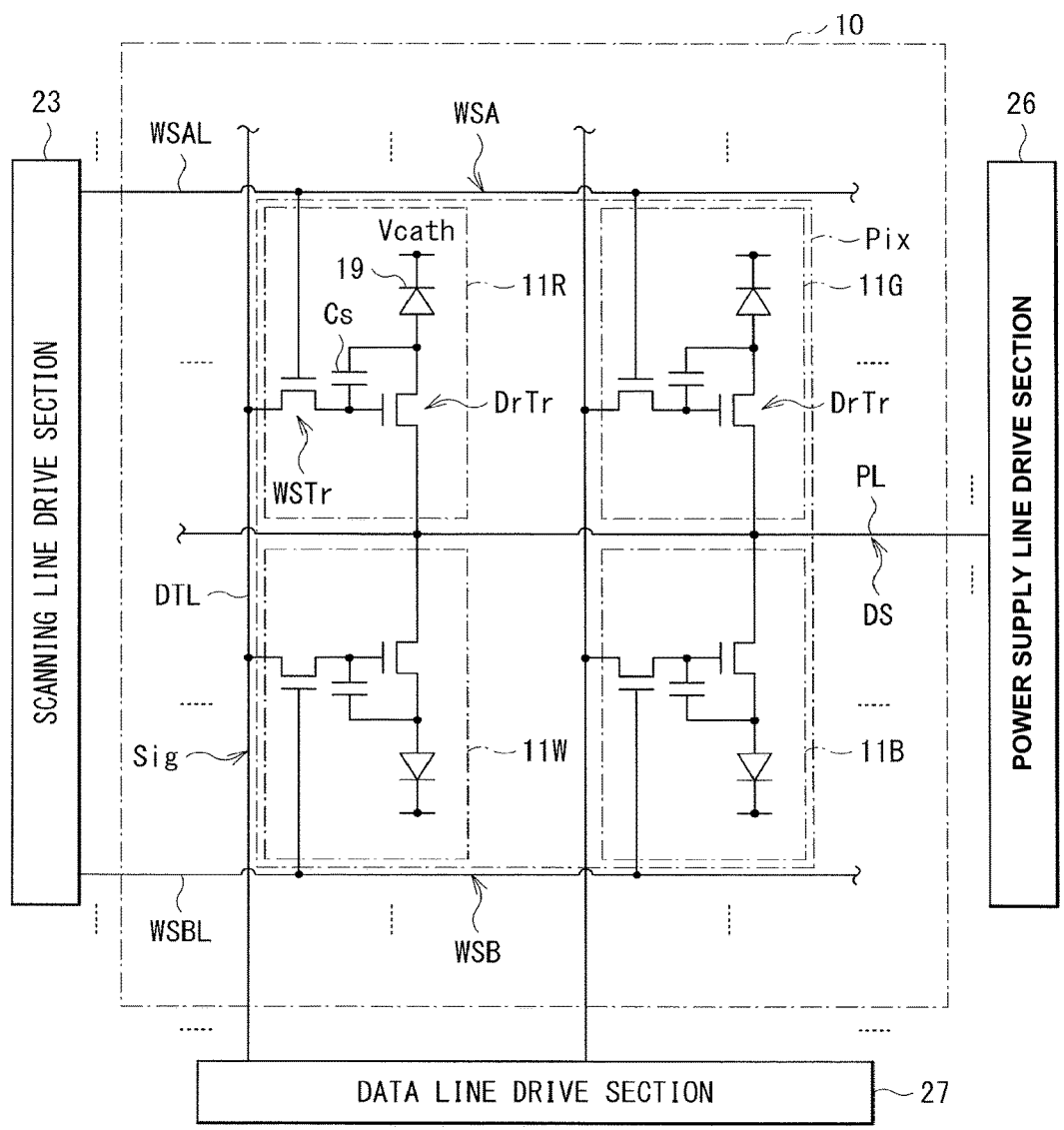

[ FIG. 4 ]
(DISPLAY SURFACE SIDE)
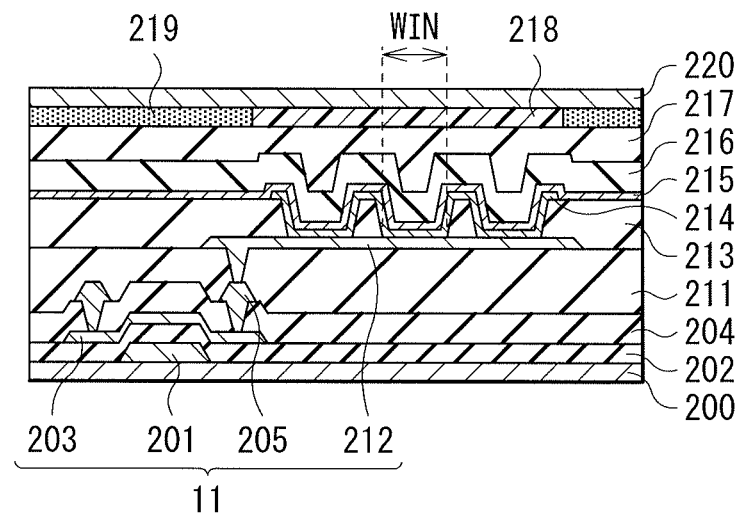
[ FIG. 5 ]
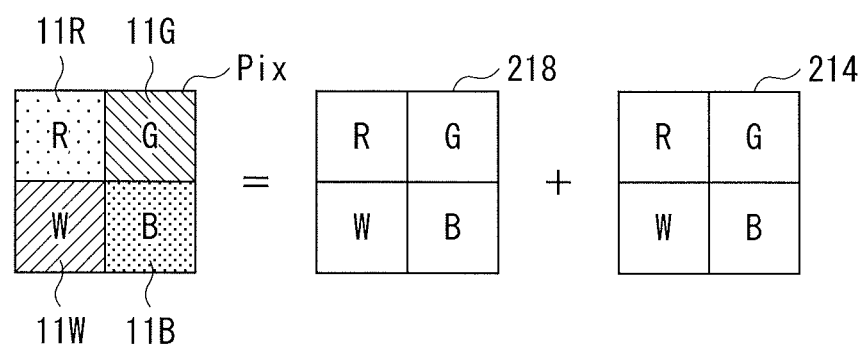

[ FIG. 6 ]
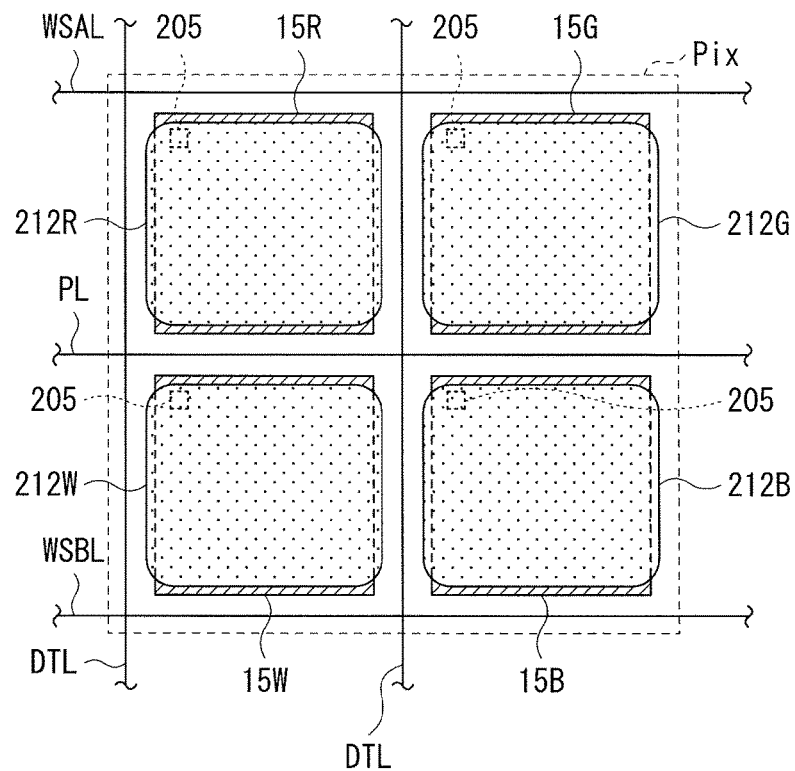
[ FIG. 7 ]
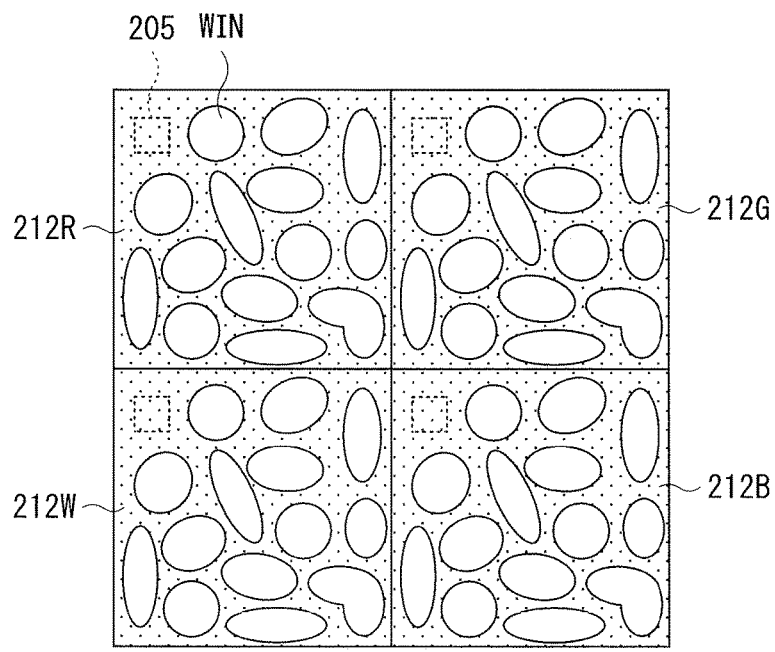

[ FIG. 8 ]
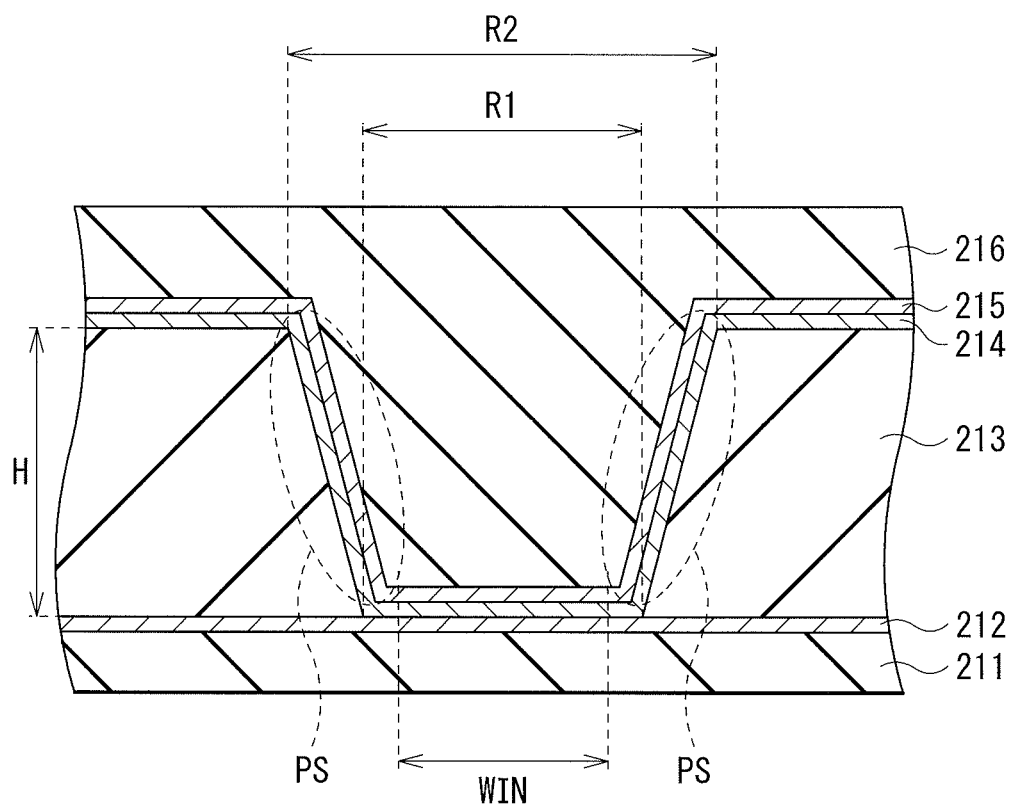

[ FIG. 9 ]
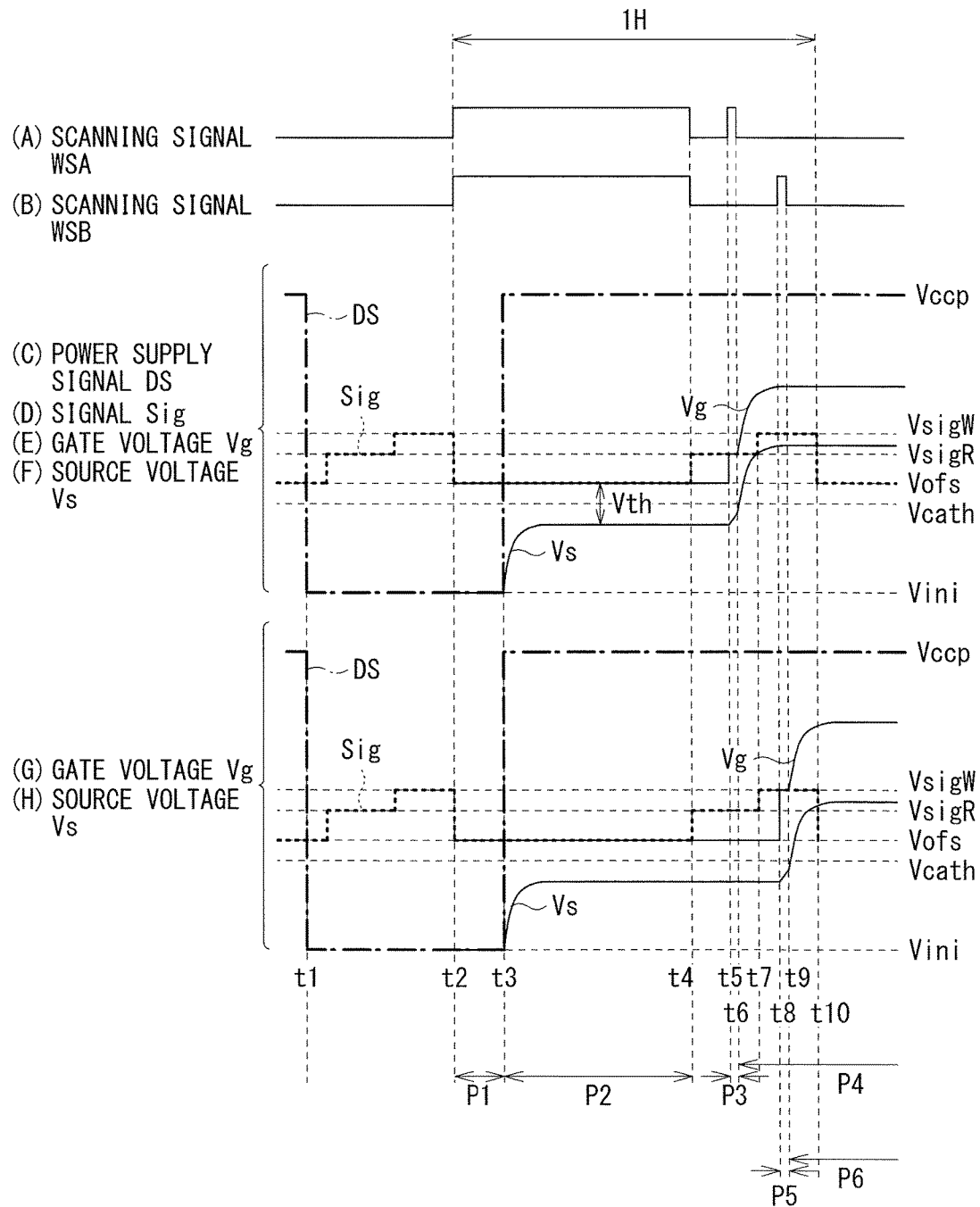

[ FIG. 10 ]
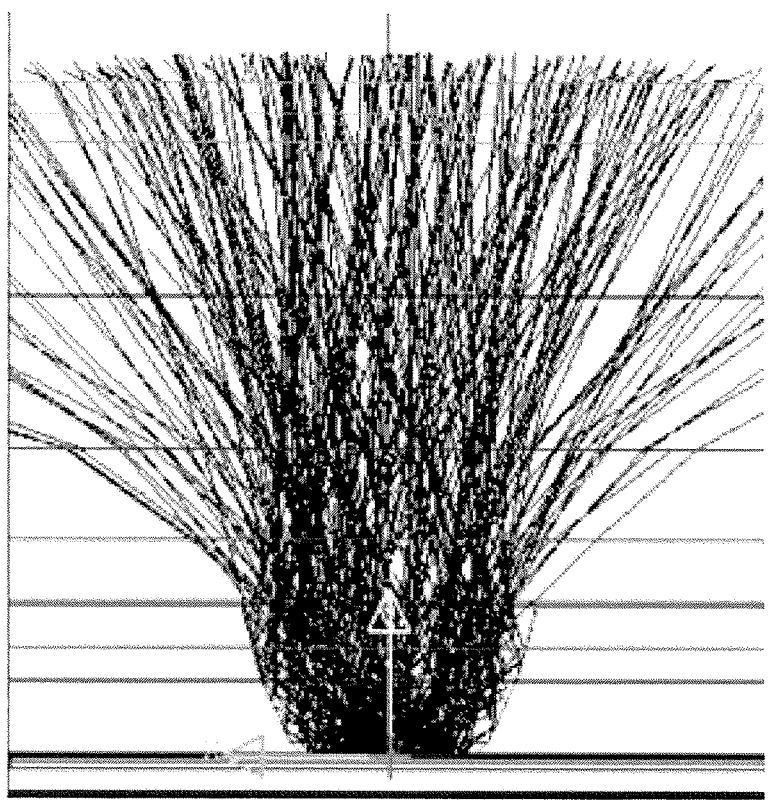

[ FIG. 11A ]
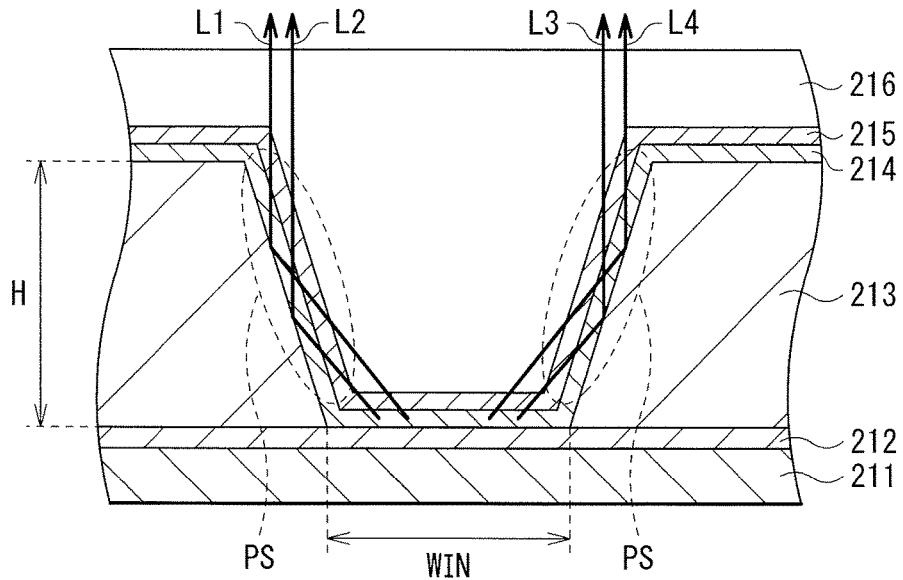
[ FIG. 11B ]
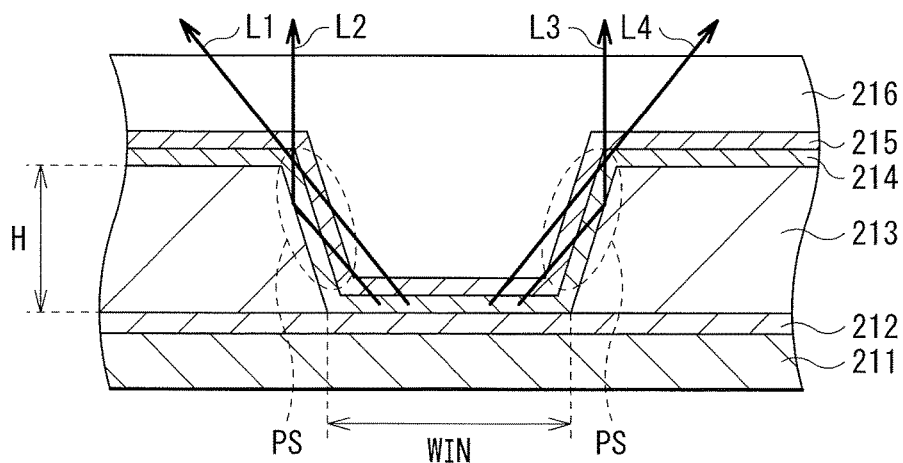
[ FIG. 11C ]
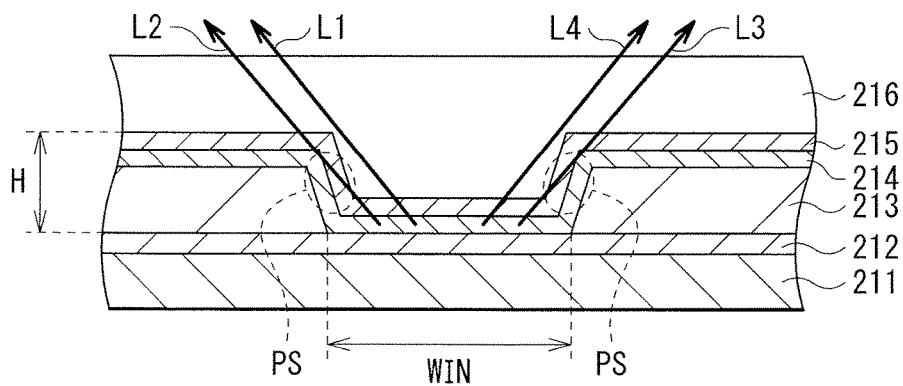

[ FIG. 12A ]
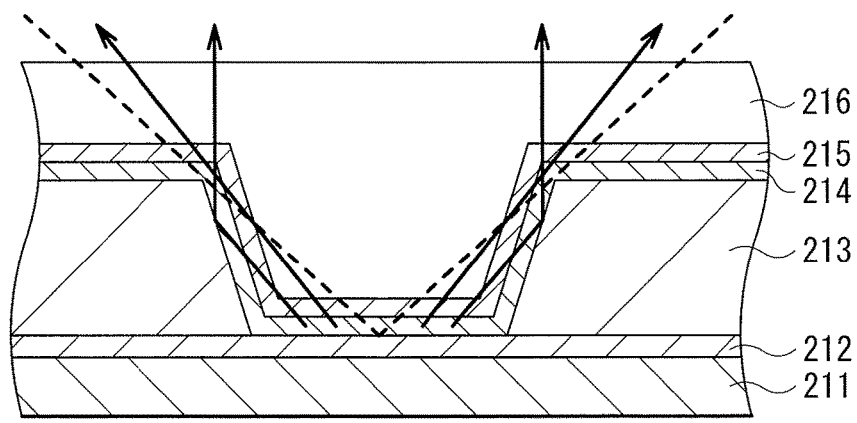
[ FIG. 12B ]
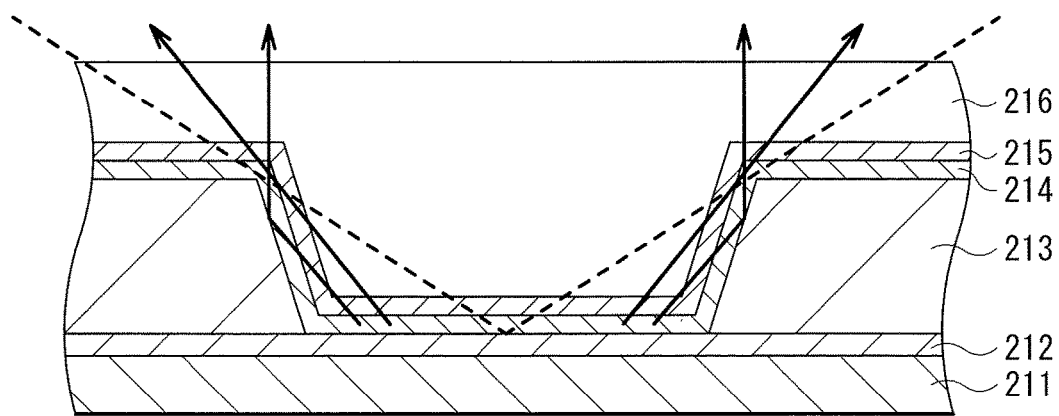

[ FIG. 13 ]
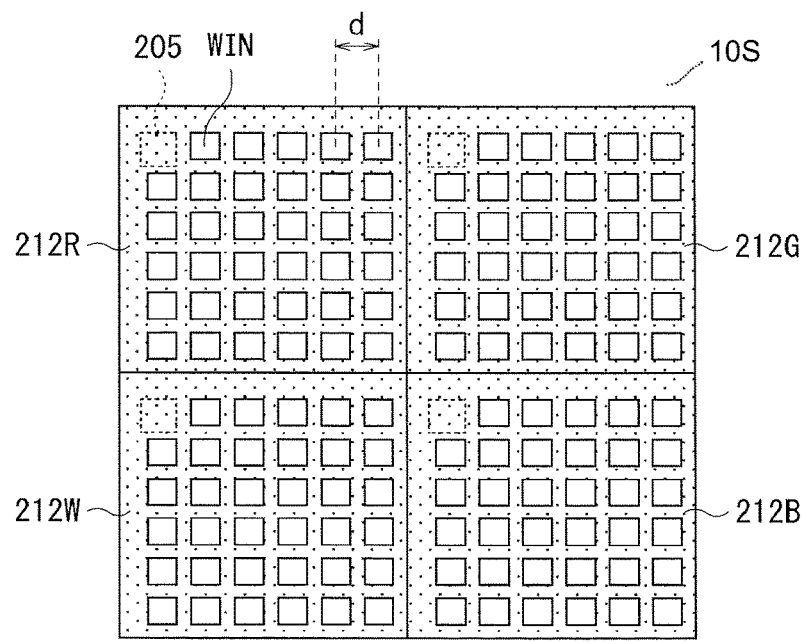
[ FIG. 14 ]
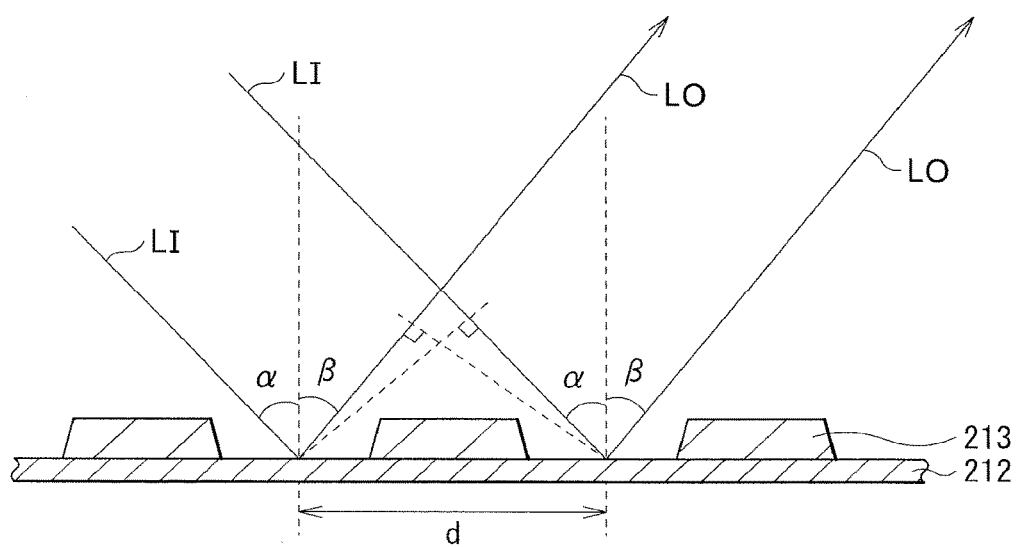

[ FIG. 15 ]
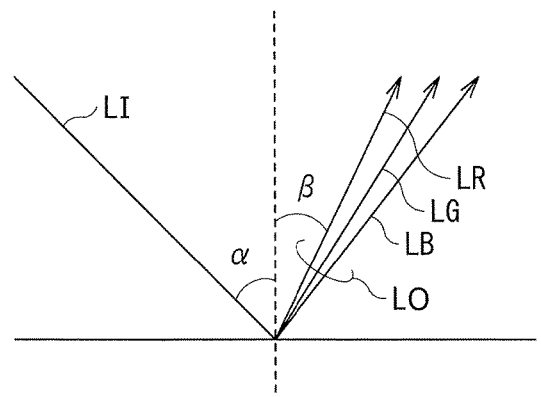
[ FIG. 16 ]
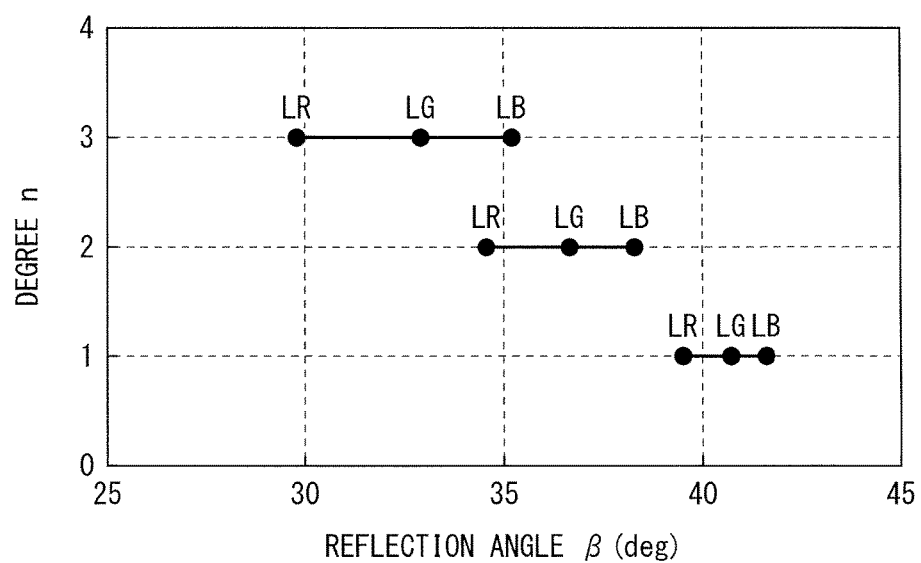

[ FIG. 17 ]
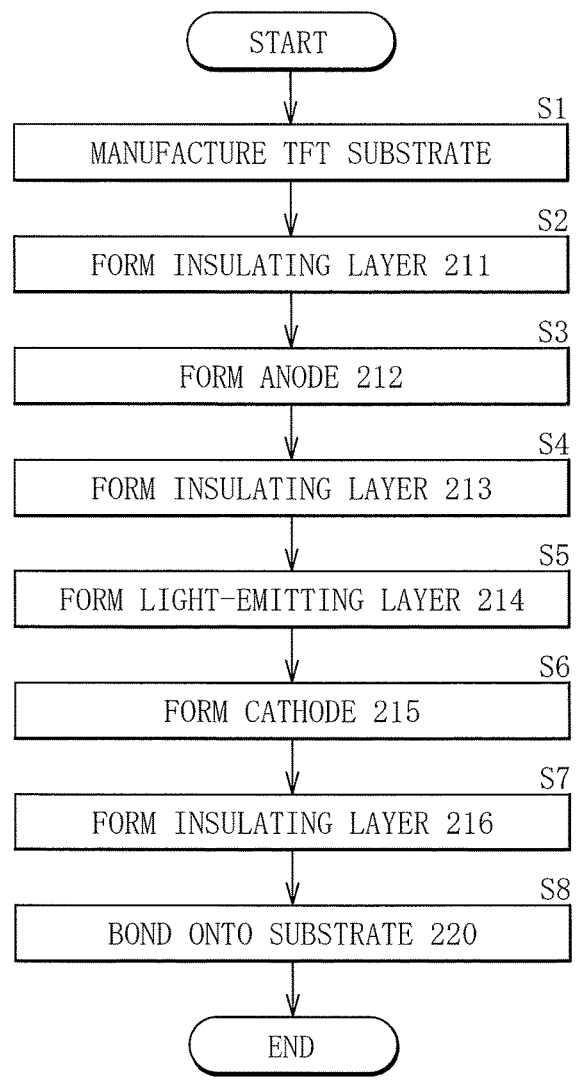

[ FIG. 18 ]
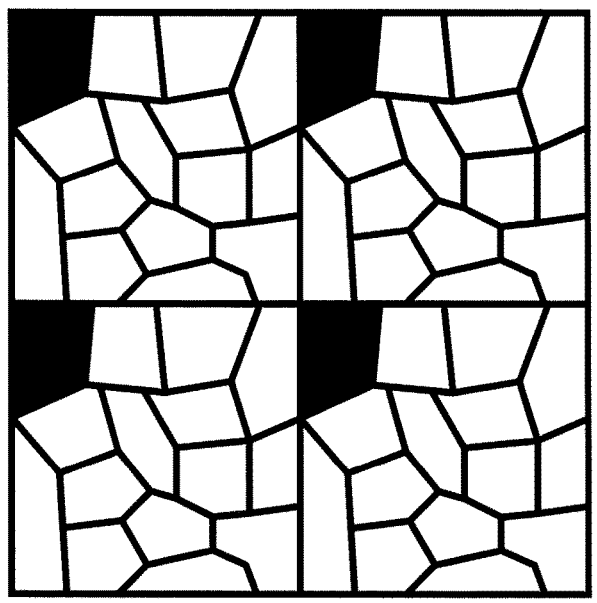

[ FIG. 19 ]
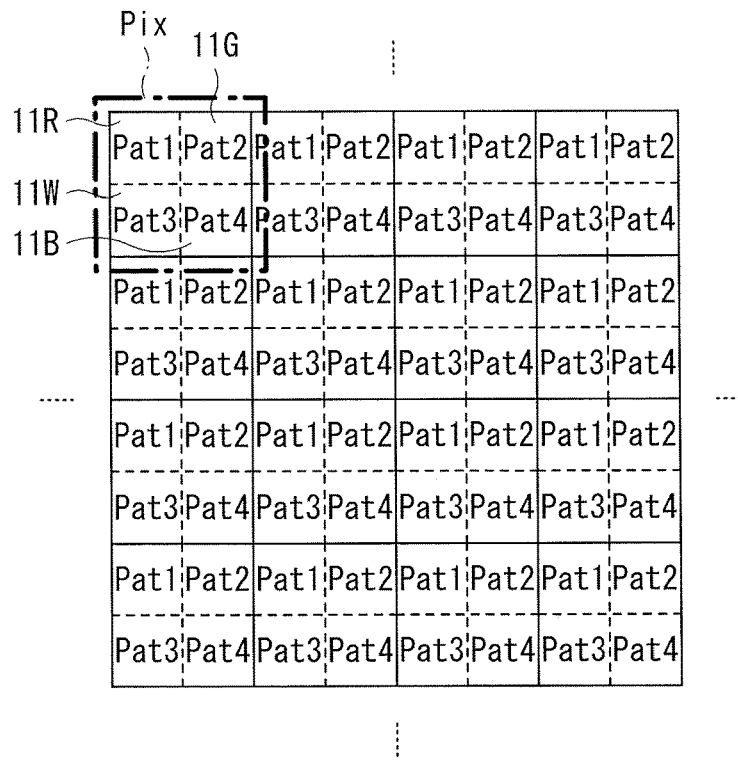
[ FIG. 20 ]
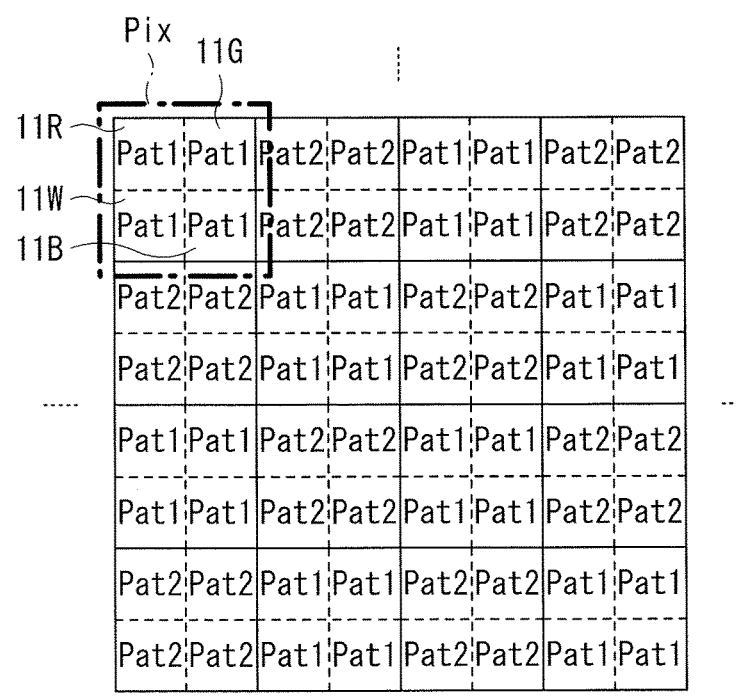

[ FIG. 21 ]
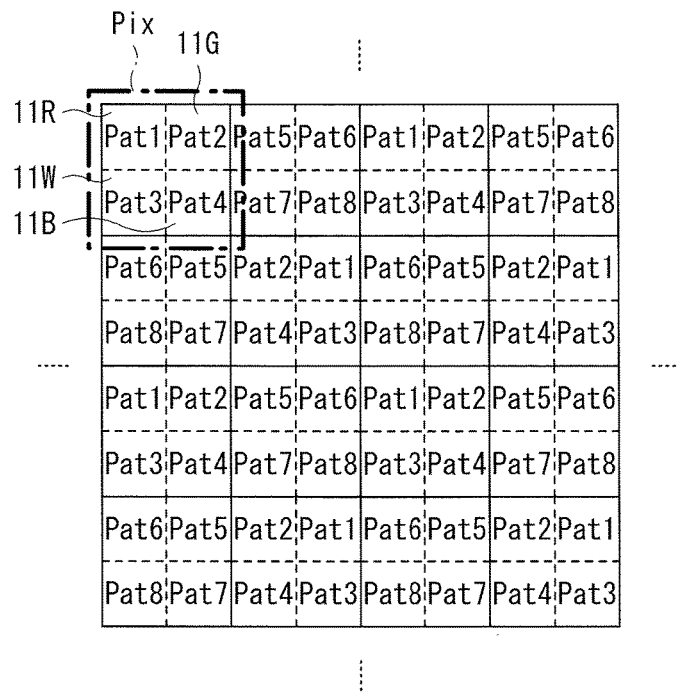
[ FIG. 22 ]
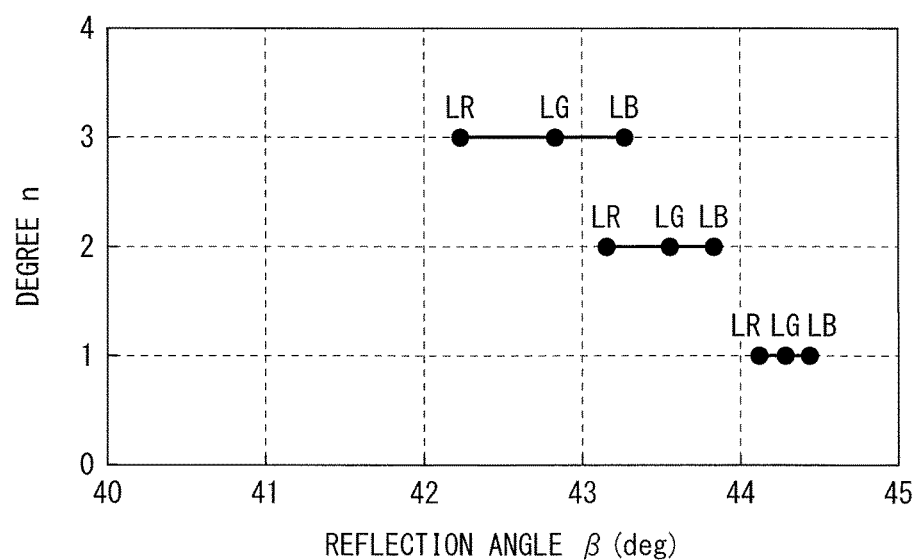

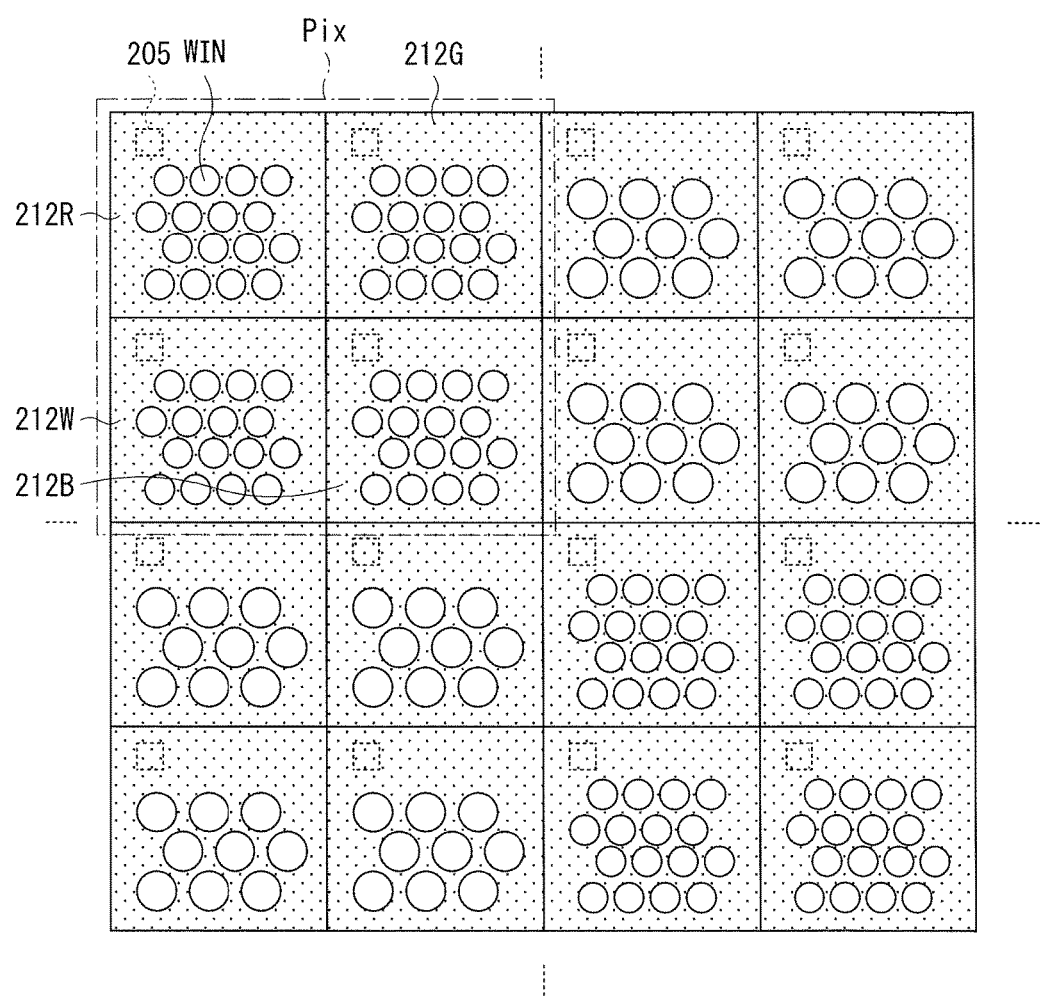
[FIG. 23]

[ FIG. 24 ]
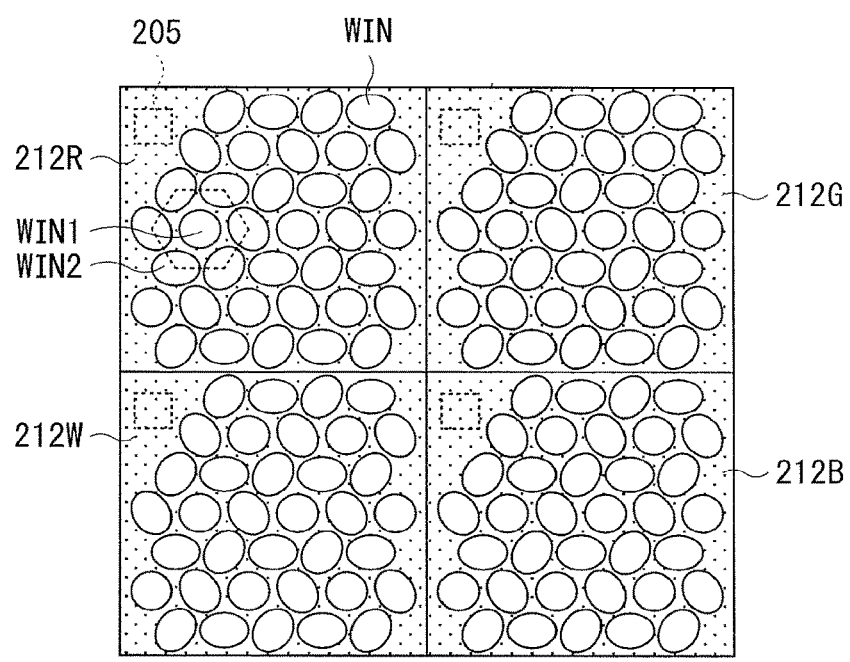

[ FIG. 25A ]
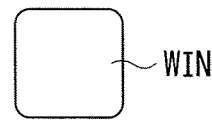
[ FIG. 25B ]
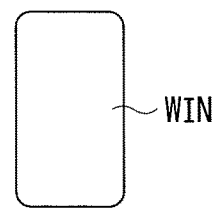
[ FIG. 25C ]
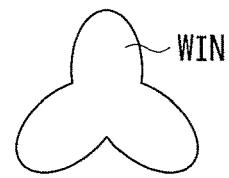
[ FIG. 25D ]
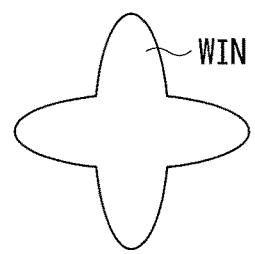
[ FIG. 25E ]
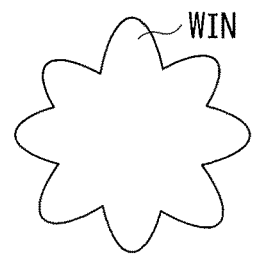

[ FIG. 26 ]
(DISPLAY SURFACE SIDE)
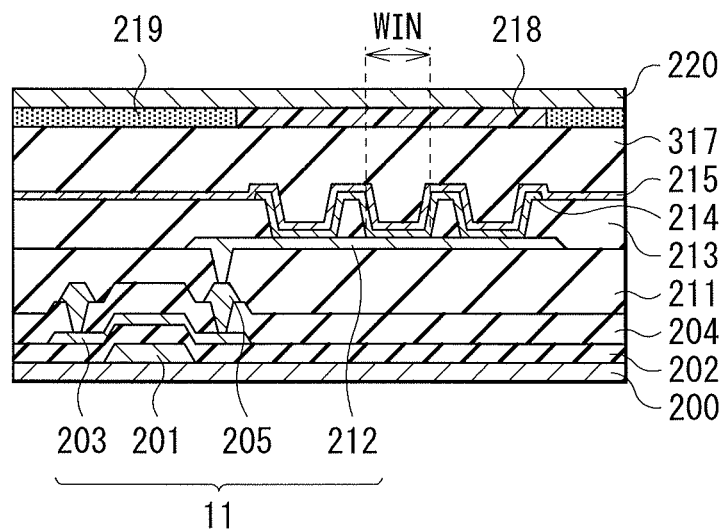
[ FIG. 27 ]
(DISPLAY SURFACE SIDE)
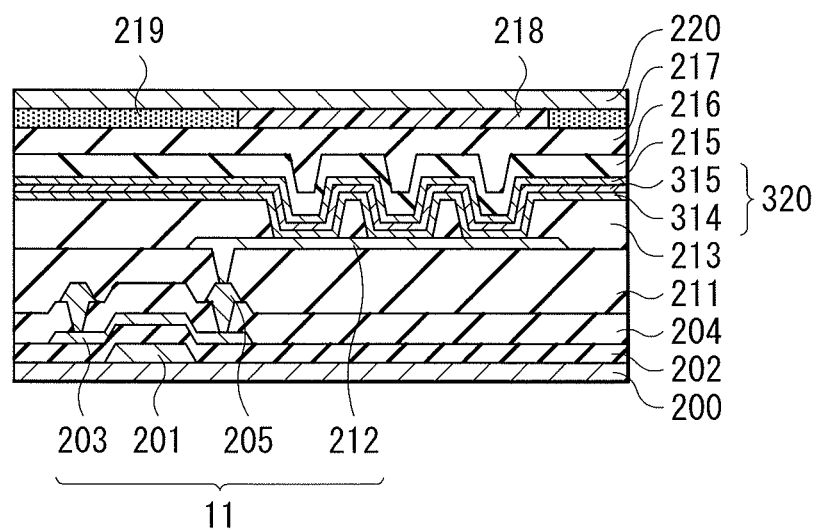

[ FIG. 28 ]
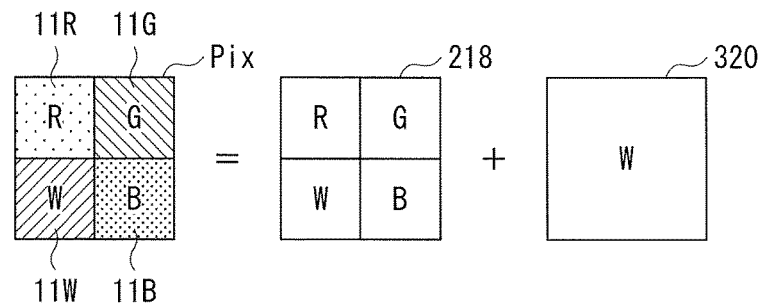
[ FIG. 29 ]
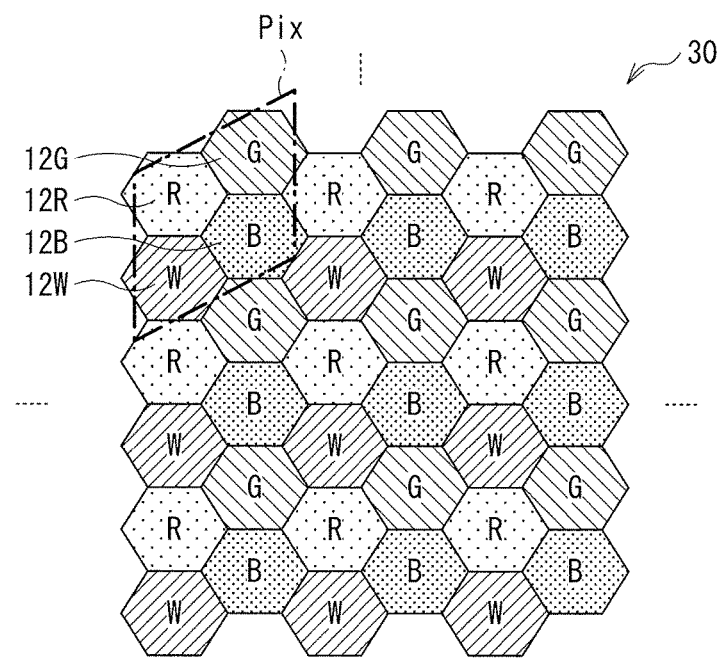

[ FIG. 30 ]
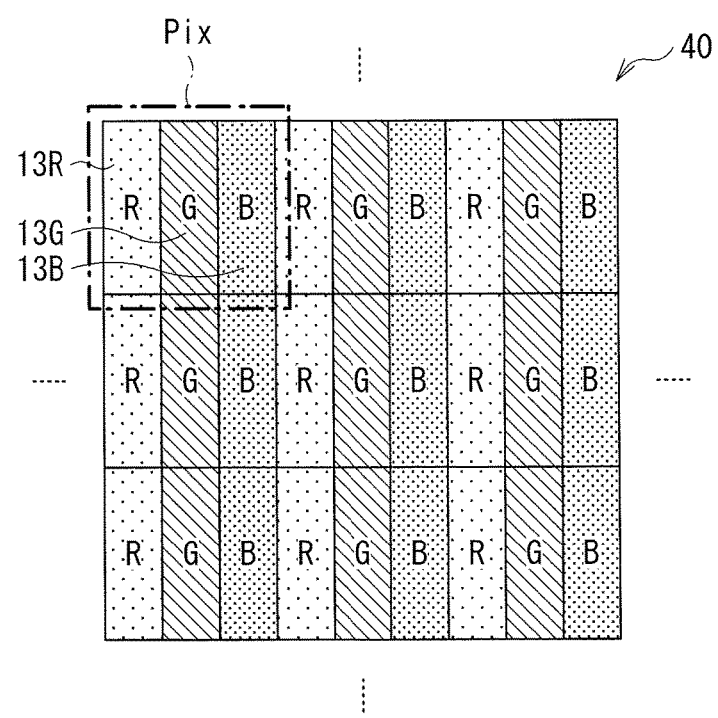

[ FIG. 31A ]
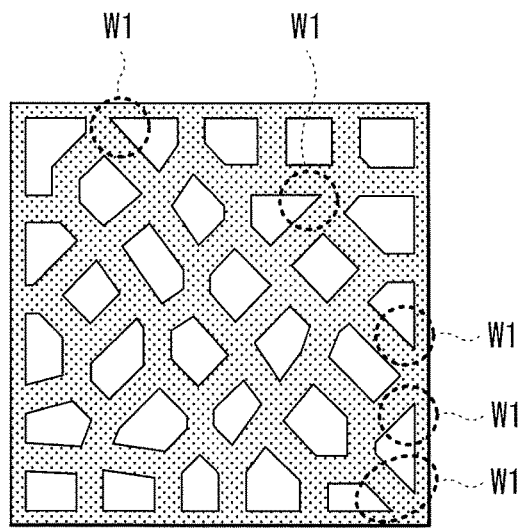
[ FIG. 31B ]
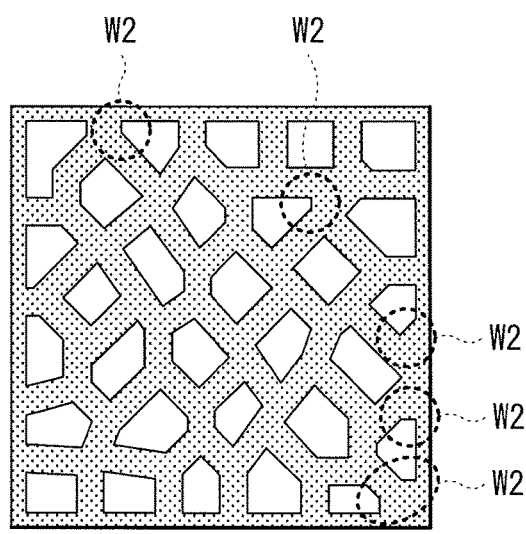

[ FIG. 32 ]
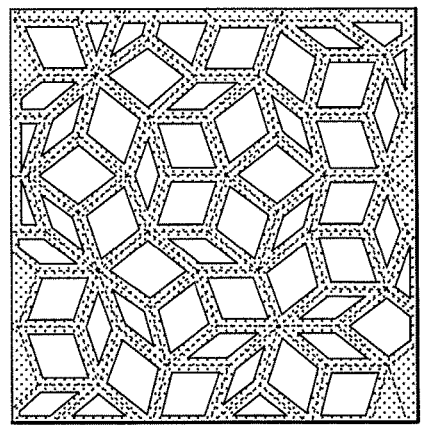
[ FIG. 33A ]
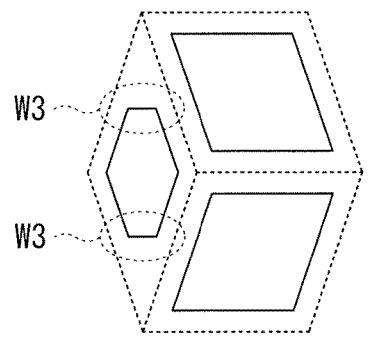
[ FIG. 33B ]
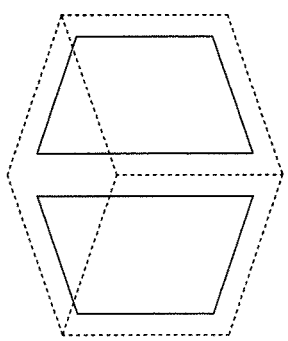

[ FIG. 34 ]
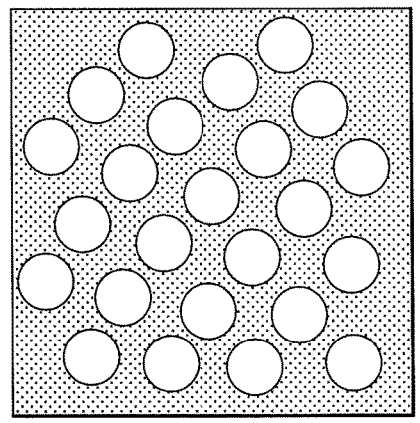
[ FIG. 35 ]
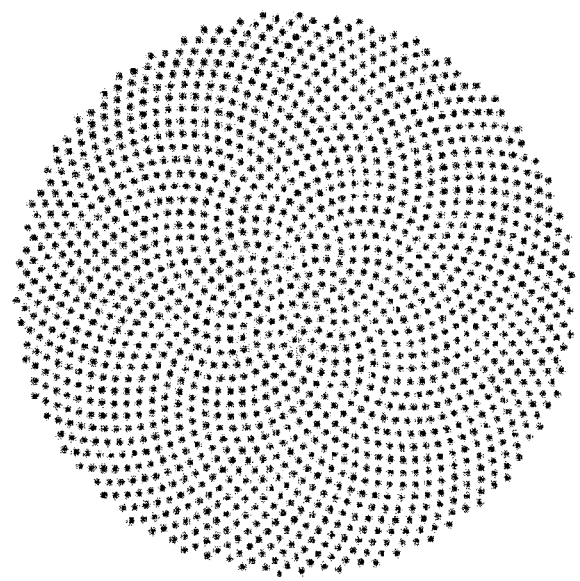

[ FIG. 36 ]
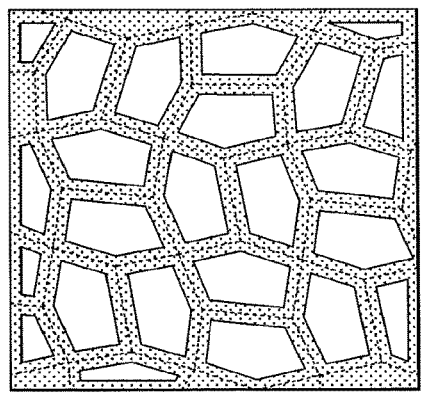
[ FIG. 37 ]
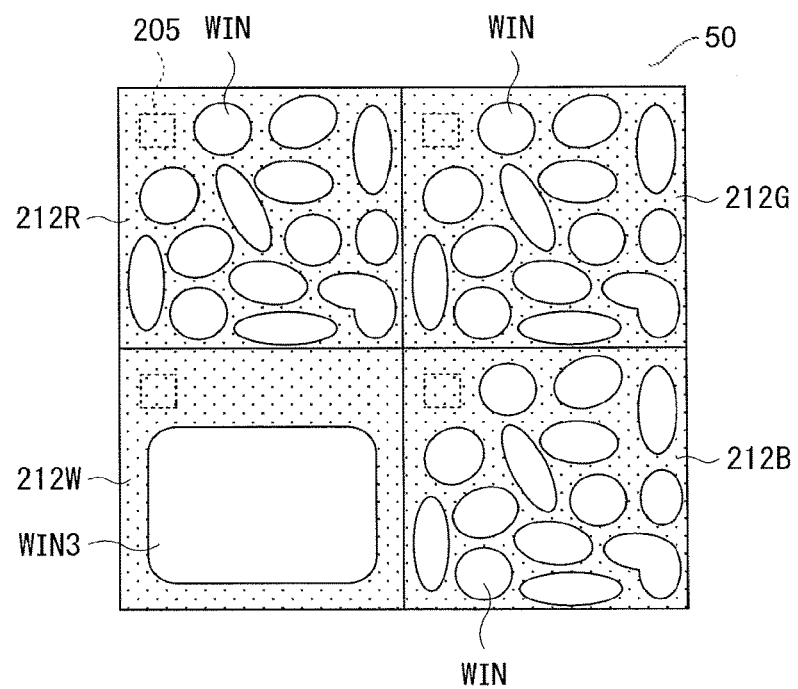

[ FIG. 38 ]
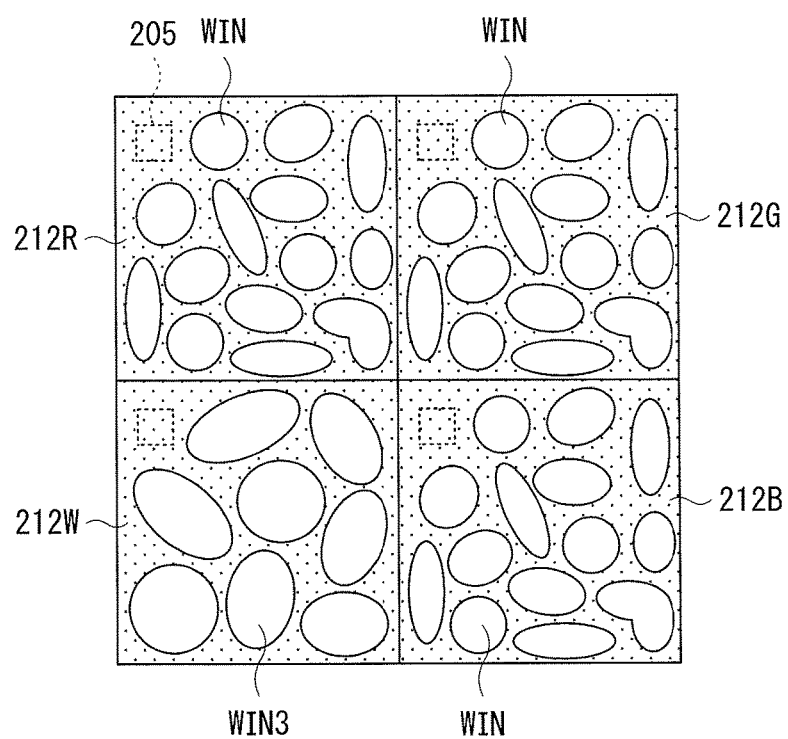

[ FIG. 39A ]
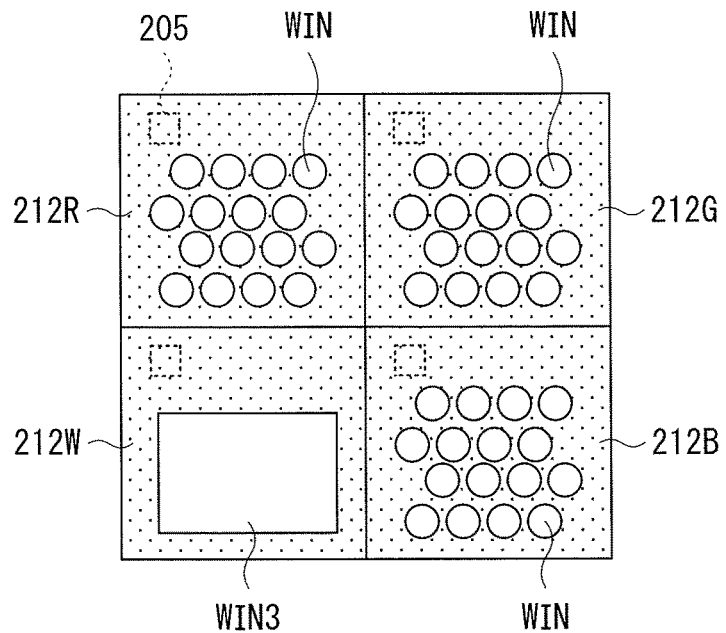
[ FIG. 39B ]
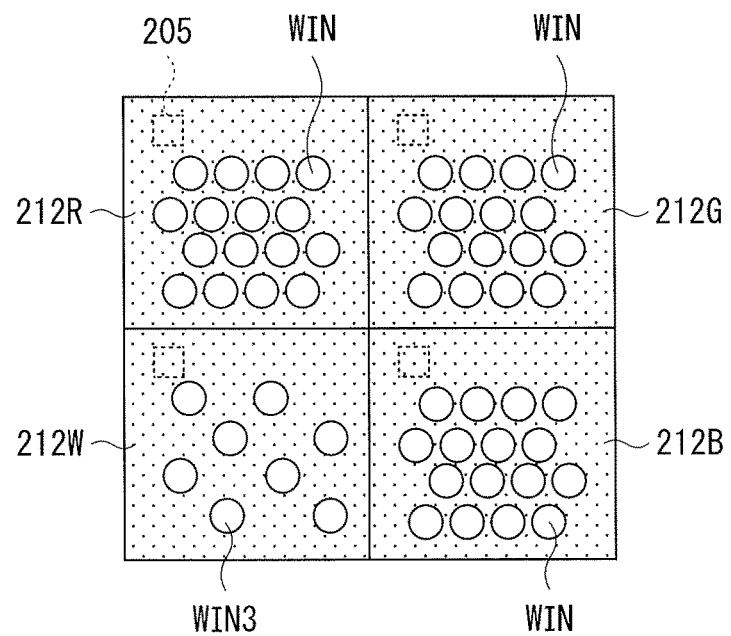

[ FIG. 39C ]
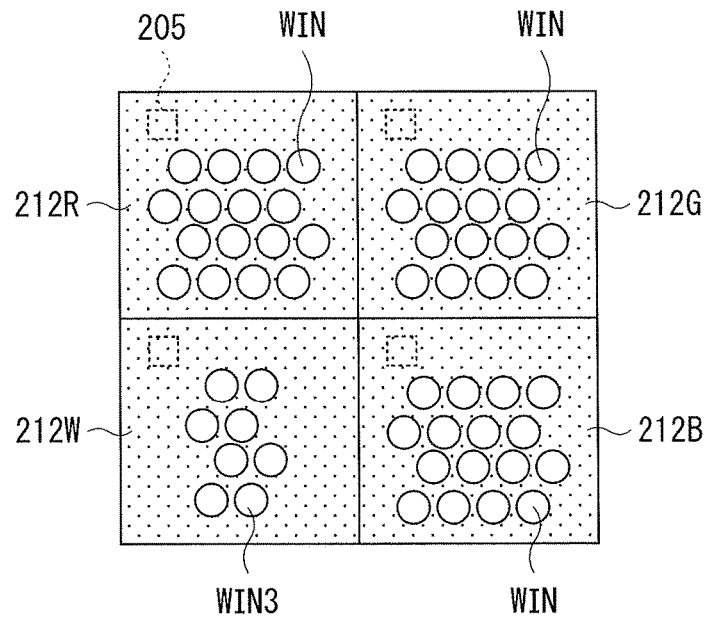
[ FIG. 39D ]
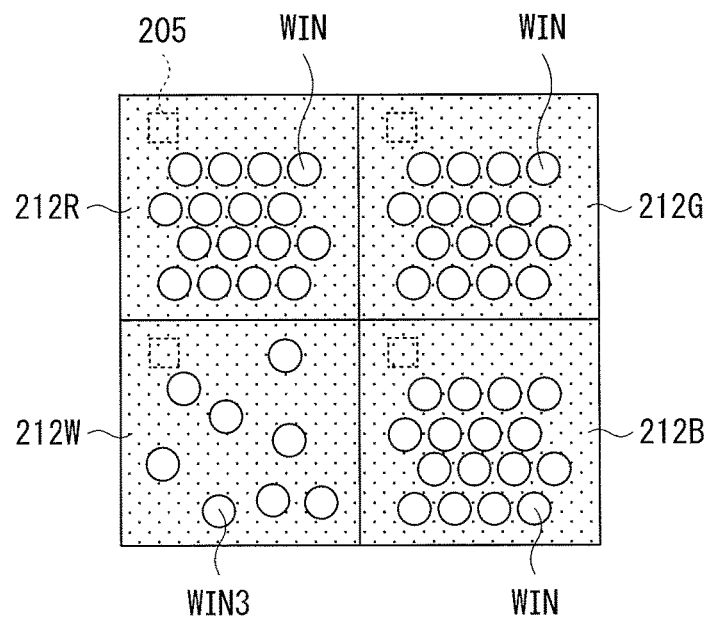

[ FIG. 40 ]
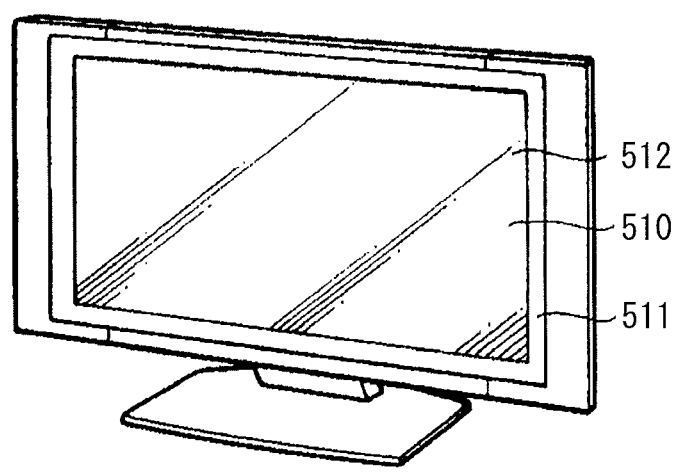

[ FIG. 41 ]
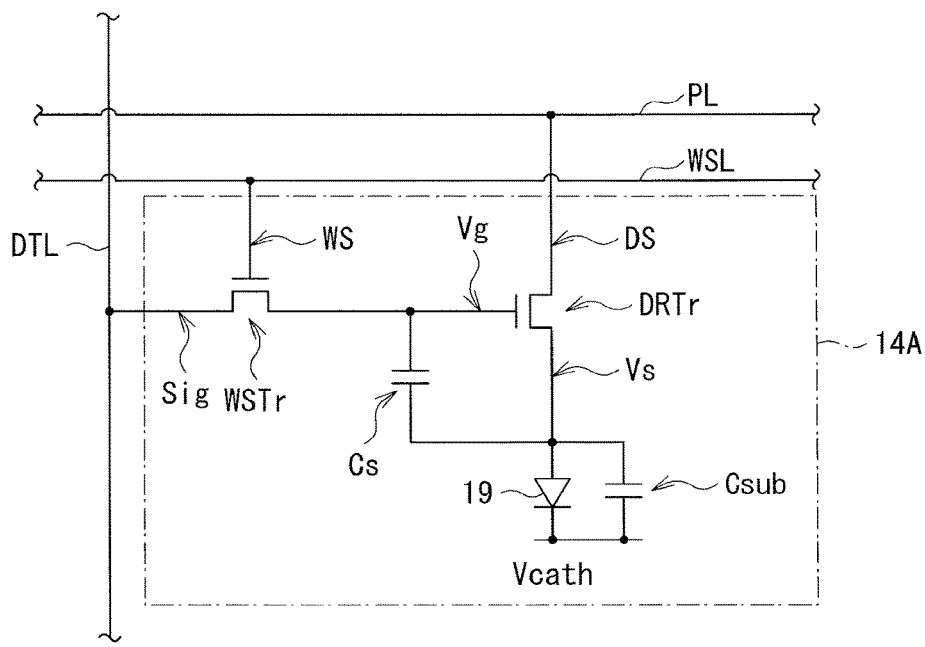
[ FIG. 42 ]
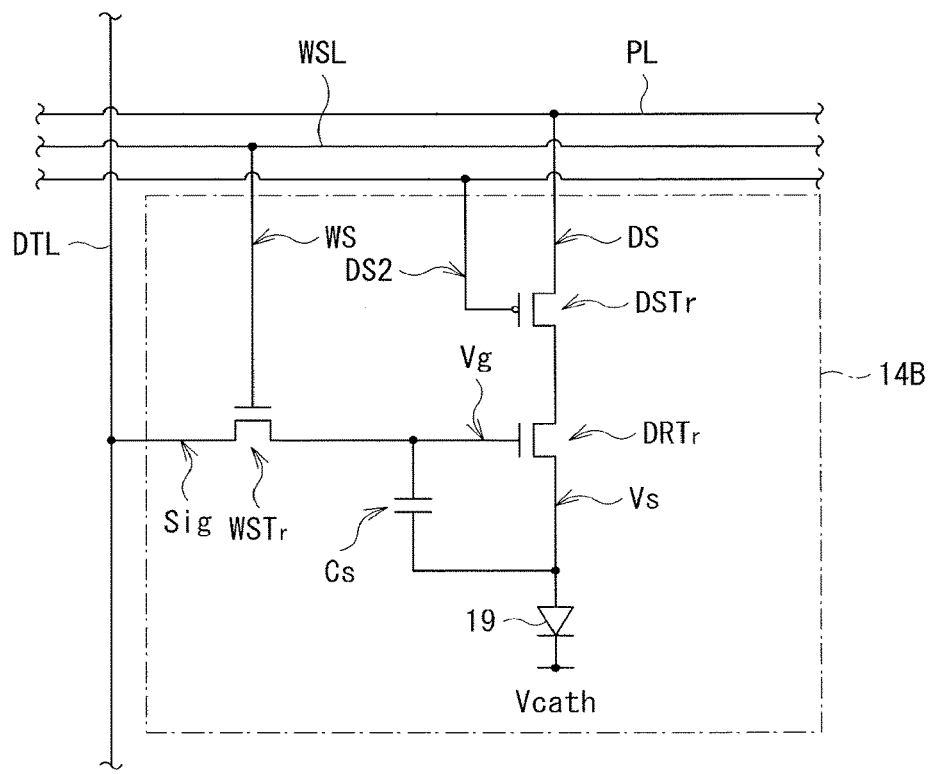

CONTROLLING LUMINANCE OF A DISPLAY UNIT

TECHNICAL FIELD

The present disclosure relates to a display unit including a current-driven display device and an electronic apparatus including such a display unit.

BACKGROUND ART

Recently, in the field of display units configured to display an image, display units (organic EL (Electro Luminescence) display units) using, as light-emitting devices, current-driven optical devices with light emission luminance changeable according to a value of a current flowing therethrough, for example, organic EL devices have been developed for commercialization. Unlike liquid crystal devices and the like, the organic EL devices are self-luminous devices; therefore, in the organic EL devices, a light source (a backlight) is not necessary. Accordingly, the organic EL display units have characteristics such as higher image visibility, lower power consumption, and higher response speed of a device, compared to liquid crystal display units needing a light source.

In some of such organic EL display units, in order to improve luminance, a reflector is provided around an opening section (a light emission region). For example, in Patent Literature 1, there is disclosed an organic EL display unit in which opening sections each provided with a reflector therearound are provided in a sub-pixel in a close packed manner.

CITATION LIST

Patent Literature

Patent Literature 1: Japanese Unexamined Patent Application Publication No. 2013-58324

SUMMARY OF INVENTION

Incidentally, in the display units, high image quality is generally desired; therefore, a further improvement in image quality is expected.

Therefore, it is desirable to provide a display unit and an electronic apparatus allowing for enhancement of image quality.

A display unit according to an embodiment of the present disclosure includes a pixel. The above-described pixel includes a plurality of sub-pixels, each of the sub-pixels including a single first electrode, a single second electrode provided along a laminating direction of the first electrode, and a light-emitting layer inserted between the first electrode and the second electrode. One or more of the plurality of sub-pixels have a plurality of light emission regions including two or more light emission regions different in one or more of shape, size, and orientation from one another.

An electronic apparatus according to an embodiment of the present disclosure includes the above-described display unit, and may correspond to, for example, a television, a digital camera, a personal computer, a video camera, a mobile terminal unit such as a mobile phone, or the like.

In the display unit and the electronic apparatus according to the embodiments of the present disclosure, in the pixel, the plurality of sub-pixels each including the single first electrode, the single second electrode, and the light-emitting layer are formed. One or more of the plurality of sub-pixels have two or more light emission regions different in one or more of shape, size, and orientation from one another.

According to the display unit and the electronic apparatus in the embodiments of the present disclosure, since one or more of the plurality of sub-pixels have two or more light emission regions different in one or more of shape, size, and orientation from one another, it is possible to enhance image quality.

BRIEF DESCRIPTION OF DRAWINGS

FIG. 1 is a block diagram illustrating a configuration example of a display unit according to an embodiment of the present disclosure.

FIG. 2 is a schematic view illustrating arrangement of sub-pixels in a display section illustrated in FIG. 1.

FIG. 3 is a circuit diagram illustrating a configuration example of the display section illustrated in FIG. 1.

FIG. 4 is a sectional view illustrating a schematic sectional configuration of the display section illustrated in FIG. 1.

FIG. 5 is an explanatory diagram illustrating configurations of the sub-pixels in the display section illustrated in FIG. 1.

FIG. 6 is a plan view illustrating an example of positions of anodes in the display section illustrated in FIG. 1.

FIG. 7 is a plan view illustrating an example of positions of opening sections in a display section according to a first embodiment.

FIG. 8 is a sectional view illustrating a configuration example of the opening section illustrated in FIG. 4.

FIG. 9 is a timing waveform diagram illustrating an operation example of the display unit illustrated in FIG. 2.

FIG. 10 is an explanatory diagram illustrating light beams in the opening section illustrated in FIG. 4.

FIG. 11A is another explanatory diagram illustrating light beams in the opening section illustrated in FIG. 4.

FIG. 11B is another explanatory diagram illustrating light beams in the opening section illustrated in FIG. 4.

FIG. 11C is another explanatory diagram illustrating light beams in the opening section illustrated in FIG. 4.

FIG. 12A is another explanatory diagram illustrating light beams in the opening section illustrated in FIG. 4.

FIG. 12B is another explanatory diagram illustrating light beams in the opening section illustrated in FIG. 4.

FIG. 13 is a plan view illustrating an example of arrangement of opening sections in a display section according to a comparative example.

FIG. 14 is an explanatory diagram for describing diffraction of outside light.

FIG. 15 is another explanatory diagram for describing diffraction of outside light.

FIG. 16 is a plot diagram illustrating a reflection angle.

FIG. 17 is a flowchart illustrating a procedure of manufacturing the display unit illustrated in FIG. 1.

FIG. 18 is a plan view illustrating a configuration example of a mask used to form the opening section.

FIG. 19 is an explanatory diagram for describing an arrangement pattern of opening sections according to a modification example of the first embodiment.

FIG. 20 is an explanatory diagram for describing an arrangement pattern of opening sections according to another modification example of the first embodiment.

FIG. 21 is an explanatory diagram for describing an arrangement pattern of opening sections according to another modification example of the first embodiment.

FIG. 22 is a plot diagram illustrating a reflection angle.

FIG. 23 is a plan view illustrating an example of arrangement of opening sections in a display section according to another modification example of the first embodiment.

FIG. 24 is a plan view illustrating an example of arrangement of opening sections in a display section according to another modification example of the first embodiment.

FIG. 25A is a plan view illustrating an example of an opening section according to another modification example of the first embodiment.

FIG. 25B is a plan view illustrating another example of an opening section according to another modification example of the first embodiment.

FIG. 25C is a plan view illustrating another example of an opening section according to another modification example of the first embodiment.

FIG. 25D is a plan view illustrating another example of an opening section according to another modification example of the first embodiment.

FIG. 25E is a plan view illustrating another example of an opening section according to another modification example of the first embodiment.

FIG. 26 is a sectional view illustrating a schematic sectional configuration of a display section according to another modification example of the first embodiment.

FIG. 27 is a sectional view illustrating a schematic sectional configuration of a display section according to another modification example of the first embodiment.

FIG. 28 is an explanatory diagram illustrating configurations of sub-pixels in the display section illustrated in FIG. 27.

FIG. 29 is a schematic view illustrating arrangement of sub-pixels in a display section according to another modification example of the first embodiment.

FIG. 30 is a schematic view illustrating arrangement of sub-pixels in a display section according to another modification example of the first embodiment.

FIG. 31A is a plan view illustrating a configuration example of a mask according to another modification example of the first embodiment.

FIG. 31B is a plan view illustrating a configuration example of a mask according to another modification example of the first embodiment.

FIG. 32 is a plan view illustrating a configuration example of a mask according to another modification example of the first embodiment.

FIG. 33A is a plan view illustrating a configuration example of a mask according to another modification example of the first embodiment.

FIG. 33B is a plan view illustrating a configuration example of a mask according to another modification example of the first embodiment.

FIG. 34 is a plan view illustrating a configuration example of a mask according to another modification example of the first embodiment.

FIG. 35 is an explanatory diagram illustrating a Fibonacci spiral.

FIG. 36 is a plan view illustrating a configuration example of a mask according to another modification example of the first embodiment.

FIG. 37 is a plan view illustrating an example of arrangement of opening sections in a display section according to a second embodiment.

FIG. 38 is a plan view illustrating an example of arrangement of opening sections in a display section according to a modification example of the second embodiment.

FIG. 39A is a plan view illustrating an example of arrangement of opening sections in a display section according to a modification example of the second embodiment.

FIG. 39B is a plan view illustrating another example of the arrangement of the opening sections in the display section according to the modification example of the second embodiment.

FIG. 39C is a plan view illustrating another example of the arrangement of the opening sections in the display section according to the modification example of the second embodiment.

FIG. 39D is a plan view illustrating another example of the arrangement of the opening sections in the display section according to the modification example of the second embodiment.

FIG. 40 is a perspective view illustrating an appearance of a television to which the display units according to the embodiments are applied.

FIG. 41 is a circuit diagram illustrating a configuration example of a sub-pixel according to another modification example.

FIG. 42 is a circuit diagram illustrating a configuration example of a sub-pixel according to another modification example.

MODE FOR CARRYING OUT THE INVENTION

Some embodiments of the present disclosure will be described in detail below referring to the accompanying drawings. It is to be noted that description will be given in the following order.
1. First Embodiment
2. Second Embodiment
3. Application Examples 1. First Embodiment Configuration Example FIG. 1 illustrates a configuration example of a display unit according to a first embodiment. A display unit 1 is an active matrix display unit using organic EL devices. It is to be noted that a method of manufacturing a display unit according to an embodiment of the present disclosure is embodied by this embodiment, and will be also described below.

The display unit 1 includes a display section 10 and a drive section 20. The drive section 20 includes an image signal processing section 21, a timing generation section 22, a scanning line drive section 23, a power supply line drive section 26, a data line drive section 27.

The display section 10 is configured of a plurality of pixels Pix provided in a matrix. As will be described below, each of the pixels Pix is configured of four sub-pixels 11 of red, green, blue, and white.

FIG. 2 illustrates an example of arrangement of the sub-pixels in the display section 10. Each of the pixels Pix includes four sub-pixels 11R, 11G, 11B, and 11W of red (R), green (G), blue (B), and white (W). In this example, these four sub-pixels 11R, 11G, 11B, and 11W are provided in an array of two rows by two columns in the pixel Pix. More specifically, in the pixel Pix, the sub-pixel 11R of red (R), the sub-pixel 11GW of green (G), the sub-pixel 11W of white (W), and the sub-pixel 11B of blue (B) are provided at the upper left, at the upper right, the lower left, and the lower right, respectively. It is to be noted that such arrangement of the four sub-pixels 11R, 11G, 11B, and 11W is recommended; however, the arrangement is not limited thereto, and any other arrangement may be adopted.

FIG. 3 illustrates an example of a circuit configuration of the display section 10. The display section 10 includes a plurality of scanning lines WSAL and WSBL and a plurality of power supply lines PL that extend along a row direction, and a plurality of data lines DTL that extend along a column direction. An end of each of the scanning lines WSAL and WSBL is connected to the scanning drive line section 23, an end of each of the power supply lines P is connected to the power supply line drive section 26, and an end of each of the data lines DTL is connected to the data line drive section 27. The sub-pixel 11R and the sub-pixel 11G belonging to one pixel Pix are connected to a same scanning line WSAL, and the sub-pixel 11B and the sub-pixel 11W belonging to the one pixel Pix are connected to a same scanning line WSBL. Moreover, the sub-pixel 11R and the sub-pixel 11W belonging to one pixel Pix are connected to a same data line DTL, and the sub-pixel 11G and the sub-pixel 11B belonging to the one pixel Pix are connected to a same data line DTL. Further, four sub-pixels 11R, 11G, 11B, and 11W belonging to one pixel Pix are connected to a same power supply line PL.

Next, a circuit configuration of the sub-pixel 11 will be described with use of the sub-pixel 11R as an example. It is to be noted that the sub-pixels 11G, 11B, and 11W have a similar circuit configuration.

The sub-pixel 1R includes a writing transistor WSTr, a driving transistor DRTr (can be interchangeably used with DrTr), a capacitor device Cs, and a light-emitting device 19. Each of the writing transistor WSTr and the driving transistor DRTr may be configured of, for example, an N-channel MOS (Metal Oxide Semiconductor) TFT (Thin Film Transistor). In the sub-pixel 11R, a gate of the writing transistor WSTr is connected to the scanning line WSAL, a source thereof is connected to the data line DTL, and a drain thereof is connected to a gate of the driving transistor DRTr and one terminal of the capacitor device Cs. In the driving transistor DRTr, the gate thereof is connected to the drain of the writing transistor WSTr and the one terminal of the capacitor device Cs, a drain thereof is connected to the power supply line PL, and a source thereof is connected to the other terminal of the capacitor device Cs and an anode of the light-emitting device 19. In the capacitor device Cs, the one terminal thereof is connected to the gate of the driving transistor DRTr and the drain of the writing transistor WSTr, and the other terminal thereof is connected to the source of the driving transistor DRTr and the anode of the light-emitting device 19. The light-emitting device 19 is configured with use of an organic EL device, and is a light-emitting device configured to emit red (R) light, and the anode thereof is connected to the source of the driving transistor DRTr and the other terminal of the capacitor device Cs, and a cathode voltage Vcath is supplied from the drive section 20 to a cathode of the light-emitting device 19.

FIG. 4 illustrates a sectional view of the sub-pixel 11 in the display section 10. The display section 10 includes a substrate 200, a gate 201, a polysilicon 203, an anode 212, an insulating layer 213, a light-emitting layer 214, a cathode 215, an insulating layer 216, and a color filter 218.

The substrate 200 is a supporting substrate of the display section 10, and may be made of, for example, glass, plastic, or the like. On the substrate 200, the gate 201 is formed. The gate 201 may be made of, for example, molybdenum (Mo) or the like. On the substrate 200 and the gate 201, the insulating layer 202 is formed. The insulating layer 202 may be made of, for example, silicon oxide ($SiO_2$), silicon nitride (SiNx), or the like. On the insulating layer 202, the polysilicon 203 is formed in a region corresponding to the gate 201. The gate 201 and the polysilicon 203 configure the driving transistor DRTr and the like. It is to be noted that in this example, the transistor is configured of a so-called bottom gate configuration in which the polysilicon 203 is formed above the gate 201; however, the transistor is not limited thereto, and the transistor may be configured of a so-called top gate configuration in which a polysilicon is formed below a gate. On the polysilicon 203 and the insulating layer 202, the insulating layer 204 is formed. The insulating layer 204 may be made of, for example, a similar material to that of the insulating layer 202. Moreover, in a part of the region where the polysilicon 203 is formed, a contact/wiring line 205 is formed to penetrate the insulating layer 204. The wiring line 205 may be configured of, for example, three layers of titanium (Ti)/aluminum (Al)/titanium (Ti).

On the insulating layer 204, the insulating layer 211 is formed. The insulating layer 211 may be made of, for example, polyimide, an acrylic resin, or the like. On the insulating layer 211, the anode 212 is formed. The anode 212 penetrates the insulating layer 211, and is connected to the contact/wiring line 205 relating to the source of the driving transistor DRTr. The anode 212 may be made of, for example, an ITO/Al alloy, an Al alloy, ITO/Ag, an ITO/Ag alloy, or the like. In other words, the anode 212 may desirably have a characteristic of reflecting light. On the anode 212 and the insulating layer 211, the insulating layer 213 is formed. The insulating layer 213 may be made of, for example, a similar material to that of the insulating layer 211. In the insulating layer 213, a plurality of opening sections WIN are provided in a part of a region where the anode 212 is formed. The light-emitting layer 214 is formed above the anode 212 and the insulating layer 213 to cover the plurality of opening sections WIN. The light-emitting layer 214 is an organic EL layer configured to emit light of a color (red, green, blue, or white) corresponding to the sub-pixel 11. More specifically, the light-emitting layer 214 configured to emit red (R) light is formed in a region corresponding to the sub-pixel 11R, the light-emitting layer 214 configured to emit green (G) light is formed in a region corresponding to the sub-pixel 11G, the light-emitting layer 214 configured to emit blue (B) light is formed in a region corresponding to the sub-pixel 11B, and the light-emitting layer 214 configured to emit white (W) light is formed in a region corresponding to the sub-pixel 11W. On the insulating layer 213 and the light-emitting layer 214, the cathode 215 is uniformly formed. The cathode 215 is a transparent or semi-transparent electrode, and may be made of, for example, magnesium-silver (MgAg) or IZO (registered trademark). In a case where the cathode 215 is made of magnesium-silver, the cathode 215 may have, for example, a film thickness of about several nm to be semi-transparent. In a case where the cathode 215 is made of IZO, the cathode 215 may be desirably formed with, for example, several tens of nm to several thousands of nm. In other words, since IZO is a transparent material, the cathode 215 may be formed with a slightly larger thickness to achieve a desired low sheet resistance value. On the cathode 215, the insulating layer 216 is formed in this example. The insulating layer 216 may be made of, for example, silicon nitride (SiNx) or the like. The insulating layer 216 is made of a material with a different refractive index from that of the insulating layer 213. More specifically, as will be described later, the refractive indices of the insulating layers 213 and 216 are so set as to allow light entering from the insulating layer 216 to be reflected by an inclined portion PS of the insulating layer 213 with which the opening section WIN is enclosed. Moreover, the insulating layer 216 also has a function of preventing change in characteristics such as light emission efficiency caused by entry of moisture into the light-emitting layer 214. The insulating layer 216 is bonded, with an insulating layer 217 made of a resin for sealing in between, onto the substrate 220 with a surface on which the color filter 218 and a black matrix 219 are formed. More specifically, the color filter 218 of red (R), the color filter 218 of green (G), the color filter 218 of blue (B), and the color filter 218 of white (W) are formed in a portion corresponding to the sub-pixel 11R, a portion corresponding to the sub-pixel 11G, a portion corresponding to the sub-pixel 11B, and a portion corresponding to the sub-pixel 11W, respectively.

By this configuration, light of red, green, blue, and white emitted from the light-emitting layers 214 travels toward a direction opposite to the substrate 200 serving as the supporting substrate. In other words, the light-emitting device 19 is a so-called top emission light-emitting device. Then, this light is outputted from a display surface through the color filter 218. More specifically, in the sub-pixel 11R, a color gamut of red (R) light is adjusted by the color filter 218 of red (R), in the sub-pixel 11G, a color gamut of green (G) light is adjusted by the color filter 218 of green (G), in the sub-pixel 11B, a color gamut of blue (B) light is adjusted by the color filter 218 of blue (B), and in the sub-pixel 11W, a color gamut of white (W) light is adjusted by the color filter 218 of white (W). It is to be noted that, in an application or the like in which a demand for image quality (a color gamut) is not so high, these color filters 218 may not be provided.

FIG. 5 schematically illustrates configurations of four sub-pixels 11 in the pixel Pix. In the sub-pixel 11R of red (R), red light emitted from the light-emitting layer 214 of red passes through the color filter 218 of red. In a similar fashion, in the sub-pixel 11G of green (G), green light emitted from the light-emitting layer 214 of green passes through the color filter 218 of green, in the sub-pixel 11B of blue (B), blue light emitted from the light-emitting layer 214 of blue passes through the color filter 218 of blue, and in the sub-pixel 11W of white (W), white light emitted from the light-emitting layer 214 of white passes through the color filter 218 of white.

FIG. 6 illustrates arrangement of the anodes 212 in the pixel Pix. In the pixel Pix, four circuit regions 15R, 15G, 15B, and 15W, and four anodes 212R, 212G, 212B, and 212W are provided.

The circuit region 15R is a region where the devices (the writing transistor WSTr, the driving transistor DRTr, and the capacitor device Cs) other than the light-emitting device 19 in the sub-pixel 11R are provided. In a similar fashion, the circuit region 15G is a region where the devices other than the light-emitting device 19 in the sub-pixel 11G are provided, the circuit region 15B is a region where the devices other than the light-emitting device 19 in the sub-pixel 11B are provided, and the circuit region 15W is a region where the devices other than the light-emitting device 19 in the sub-pixel 11W are provided. In this example, layouts of the circuit regions 15R, 15G, 15B, and 15W are almost the same as one another except for a connection portion between the scanning lines WSAL and WSBL and the power supply line PL. It is to be noted that the layouts are not limited thereto, and alternatively, for example, the layouts of the circuit regions 15R and 15B may be vertically inverted layouts of the circuit regions 15B and 15W, or the layouts of the circuit regions 15R, 15G, 15B, and 15W may be completely different from one another. Layout work efficiency is allowed to be enhanced with use of a same layout by rotating or inverting the layout.

The anode 212R is an anode of the sub-pixel 11R, the anode 212G is an anode of the sub-pixel 11G, the anode 212B is an anode of the sub-pixel 11B, and the anode 212W is an anode of the sub-pixel 11W. These anodes 212R, 212G, 212B, and 212W are connected to the sources of the driving transistors DRTr formed in the circuit regions 15R, 15G, 15B, and 15W through contacts 205, respectively. In this example, the contacts 205 each have a square shape, and are provided at the upper left of the anodes 212R, 212G, 212B, and 212W.

FIG. 7 schematically illustrates arrangement of the opening sections WIN in each anode 212. As illustrated in FIG. 6, the anodes 212R, 212G, 212B, and 212W are formed separately from one another; however, for convenience of description, in FIG. 7, they are adjacent to one another. In each of the anodes 212R, 212G, 2128, and 212W, a plurality of opening sections WIN with various shapes are randomly provided. In other words, the opening sections WIN do not have the same shape as one another, and have various shapes such as a circular shape, an ellipsoidal shape, a shape in which a circular shape and a ellipsoidal shape are connected. It is to be noted that the ellipsoidal shape is not limited to a strict definition of the ellipsoidal shape, and simply means "an elongated circular shape". Moreover, the plurality of opening sections WIN are provided in each anode 212 not to have definite regularity, for example, providing them in an orderly fashion along a predetermined direction. It is to be noted that, in this example, areas of the respective opening sections WIN are substantially equal to one another. Thus, it is possible to easily determine conditions for photolithography at the time of manufacturing. These opening sections WIN are provided in positions different from a position where the contact 205 is formed. Moreover, in this example, in the respective anodes 212R, 212G, 2128, and 212W, the plurality of opening sections WIN are provided in a same arrangement pattern.

FIG. 8 illustrates a main-part sectional configuration of the opening section WIN. The insulating layer 213 is formed with a thickness equal to a height H, and in an opening portion of the insulating layer 213, a width R1 closer to the anode 212 is smaller than a width R2 closer to a display surface. In other words, in the insulating layer 213, an inclined portion PS is provided to enclose the opening section WIN. Therefore, as will be described later, light emitted from the light-emitting layer 214 in the opening section WIN toward the inclined portion PS is reflected by the inclined portion PS by a difference in refractive index between the insulating layer 213 and the insulating layer 216 to travel toward a front direction of the display surface. In other words, the inclined portion PS functions as a so-called reflector that reflects light emitted from the light-emitting layer 214. As a result, in the display section 10, it is possible to enhance extraction efficiency of light to outside. In order to efficiently reflect light by the inclined portion PS, a refractive index n1 of the insulating layer 216 and a refractive index n2 of the insulating layer 213 may desirably satisfy the following expressions.

$$1.1 \leq n1 \leq 1.8 \tag{1}$$

$$n1-n2>0.20 \tag{2}$$

In FIG. 1 and the like, the image signal processing section 21 performs, on an image signal Sdisp supplied from outside, predetermined processing such as conversion from an RGB signal to an RGBW signal and gamma conversion to generate an image signal Sdisp2.

The timing generation section 22 is a circuit that supplies control signals to the scanning line drive section 23, the power supply line drive section 26, and the data line drive section 27, based on a synchronization signal Ssync supplied from outside to perform control on the scanning line drive section 23, the power supply line drive section 26, and the data line drive section 27, thereby operating them in synchronization with one another.

The scanning line drive section 23 is configured to sequentially apply a scanning signal WSA and a scanning signal WSB to the plurality of scanning lines WSAL and the plurality of scanning lines WSBL, respectively, in response to the control signal supplied from the timing generation section 22 to sequentially select the sub-pixels 11.

The power supply line drive section 26 is configured to perform control of light emission operation and light extinction operation of the sub-pixels 11 by sequentially applying a power supply signal DS to the plurality of power supply lines PL in response to the control signal supplied from the timing generation section 22. The power supply signal DS is changed between a voltage Vccp and a voltage Vini. As will be described later, the voltage Vini is a voltage used to initialize the sub-pixel 11, and the voltage Vccp is a voltage used to allow the light-emitting device 19 to emit light by feeding a current through the driving transistor DRTr.

The data line drive section 27 is configured to generate a signal Sig including a pixel voltage Vsig that indicates light emission luminance of each sub-pixel 11 and a voltage Vofs used to perform Vth correction that will be described later in response to the image signal Sdisp2 supplied from the image signal processing section 21 and the control signal supplied from the timing generation section 22 to apply the signal Sig to each of the data lines DTL.

By this configuration, as will be described later, the drive section 20 performs, on the sub-pixels 11, correction (Vth correction and µ (mobility) correction) for reduction in an influence of device variation of the driving transistor DRTr exerted on image quality, and performs writing of the pixel voltage Vsig on the sub-pixels 11. After that, the light-emitting devices 19 of the sub-pixels 11 emit light with luminance according to the written pixel voltage Vsig.

Herein, the anode corresponds to a specific example of "a first electrode" in the present disclosure. The cathode 215 corresponds to a specific example of "a second electrode" in the present disclosure. The opening section WIN corresponds to a specific example of "a light emission region" in the present disclosure. The insulating layer 213 corresponds to a specific example of "a first insulating layer" in the present disclosure. The insulating layer 216 corresponds to a specific example of "a second insulating layer" in the present disclosure. The sub-pixels 11R, 11G, and 11B correspond to specific examples of "a first sub-pixel, a second sub-pixel, and a third sub-pixel" in the present disclosure. The sub-pixel 11W corresponds to a specific example of "a fourth sub-pixel" in the present disclosure.

[Operation and Functions]

Next, an operation and functions of the display unit 1 according to this embodiment will be described below.

(Summary of Entire Operation)

First, a summary of an entire operation of the display unit 1 will be described below referring to FIG. 1. The image signal processing section 21 performs predetermined processing on the image signal Sdisp supplied from outside to generate the image signal Sdisp2. The timing generation section 22 supplies control signals to the scanning line drive section 23, the power supply line drive section 26, and the data line drive section 27, based on the synchronization signal Ssync supplied from outside to perform control on the scanning line drive section 23, the power supply line drive section 26, and the data line drive section 27, thereby operating them in synchronization with one another. The scanning line drive section 23 sequentially applies the scanning signal WSA and the scanning signal WSB to the plurality of scanning lines WSAL and the plurality of scanning lines WSBL, respectively, in response to the control signal supplied from the timing generation section 22 to sequentially select the sub-pixels 11. The power supply line drive section 26 sequentially applies the power supply signal DS to the plurality of power supply lines PL in response to the control signal supplied from the timing generation section 22 to perform control of the light emission operation and light extinction operation of the sub-pixels 11. The data line drive section 27 generates the signal Sig including the pixel voltage Vsig corresponding to the luminance of each sub-pixel 11 and the voltage Vofs used to perform Vth correction in response to the image signal Sdisp2 supplied from the image signal processing section 21 and the control signal supplied from the timing generation section 22 to apply the signal Sig to each of the data lines DTL. The display section 10 performs display, based on the scanning signals WSA and WSB, the power supply signal DS, and the signal Sig supplied from the drive section 20.

(Specific Operation)

Next, a specific operation of the display unit 1 will be described with use of two sub-pixels 11R and 11W belonging to one pixel Pix as examples.

FIG. 9 illustrates a timing chart of operations of the sub-pixels 11R and 11W, where (A) indicates a waveform of the scanning signal WSA, (B) indicates a waveform of the scanning signal WSB, (C) indicates a waveform of the power supply signal DS, (D) indicates a waveform of the signal Sig, (E) indicates a waveform of the gate voltage Vg of the driving transistor DRTr in the sub-pixel 11R, (F) indicates the source voltage Vs of the driving transistor DRTr in the sub-pixel 11R, (G) indicates a waveform of the gate voltage Vg of the driving transistor DRTr in the sub-pixel 11W, and (H) indicates a waveform of the source voltage Vs of the driving transistor DRTr in the sub-pixel 11W. In FIGS. 9(C) to (F), the respective waveforms are illustrated with use of a same voltage axis, and in FIGS. 9(G) and (H), the respective waveforms are illustrated with a same voltage axis in a similar fashion. It is to be noted that, for convenience of description, along the same voltage axis as that in FIGS. 9(G) and (H), the same waveforms as those of the power supply signal DS (FIG. 9(C)) and the signal Sig (FIG. 9(D)) are illustrated.

The drive section 20 performs initialization of the sub-pixels 11R and 11W in one horizontal period (1H) (an initialization period P1), and performs Vth correction in order to reduce the influence of device variation of the driving transistor DRTr exerted on image quality (a Vth correction period P2). After that, while writing of a pixel voltage VsigR is performed on the sub-pixel 11R, µ (mobility) correction different from the Vth correction is performed (a writing-µ correction period P3), and the light-emitting device 19 of the sub-pixel 11R emits light with luminance according to the written pixel voltage VsigR (a light emission period P4). After that, in a similar fashion, while writing of a pixel voltage VsigW is performed on the sub-pixel 11W, µ (mobility) correction is performed (a writing-µ correction period P5), and the light-emitting device 19 of the sub-pixel 11W emits light with luminance according to the written pixel voltage VsigW (a light emission period P6). A specific description about this will be given below.

First, the power supply line drive section 26 changes the power supply signal DS from a voltage Vccp to a voltage Vini at a timing t1 before the initialization period P1 (FIG. 9(C)). Thus, the driving transistors DRTr of the sub-pixels 11R and 11W are turned to an ON state, and the source voltages Vs of the driving transistors DRTr are set to the voltage Vini (FIGS. 9(F) and (H)).

Subsequently, the drive section 20 initializes the sub-pixels 11R and 11W in a period from a timing t2 to a timing t3 (the initialization period P1). More specifically, at the timing t2, the data line drive section 27 sets the signal Sig to the voltage Vofs (FIG. 9(D)), and the scanning line drive section 23 changes voltages of the scanning signals WSA and VVSB from a low level to a high level (FIGS. 9(A) and (B)). Thus, the writing transistors VVSTr of the sub-pixels 11R and 11VV are turned to the ON state, and the gate voltages Vg of the driving transistors DRTr of the sub-pixels 11R and 11W are set to the voltage Vofs (FIGS. 9(E) and (G)). Accordingly, gate-source voltages Vgs (=Vofs−Vini) of the driving transistors DRTr of the sub-pixels 11R and 11W are set to a larger voltage than a threshold voltage Vth of the driving transistor DRTr, thereby initializing the sub-pixels 11R and 11W.

Subsequently, the drive section 20 performs Vth correction in a period from the timing t3 to a timing t4 (the Vth correction period P2). More specifically, at the timing t3, the power supply line drive section 26 changes the power supply signal DS from the voltage Vini to the voltage Vccp (FIG. 9(C)). Accordingly, the driving transistors DRTr of the sub-pixels 11R and 11W operate in a saturation region, and a current Ids flows from each of the drains thereof to each of the sources thereof to increase the source voltages Vs thereof (FIGS. 9(F) and (H)). At this time, in this example, the source voltage Vs is lower than the voltage Vcath of a cathode of the light-emitting device 19; therefore, the light-emitting device 19 is kept in a reverse bias state, and a current does not flow through the light-emitting device 19. Thus, the gate-source voltage Vgs is decreased by increasing the source voltage Vs in such a manner; therefore, the current Ids is decreased. The current Ids is converged toward "0" (zero) by this reverse feedback operation. In other words, the gate-source voltages Vgs of the driving transistors DRTr of the sub-pixels 11R and 11W are converged to be equal to the threshold voltage Vth of the driving transistor DRTr (Vgs=Vth).

Subsequently, the scanning line drive section 23 changes the voltages of the scanning signals VVSA and VVSB from the high level to the low level at the timing t4 (FIGS. 9(A) and (B)). Accordingly, the writing transistors WSTr of the sub-pixels 11R and 11W are turned to an OFF state. At the same time, the data line drive section 27 sets the signal Sig to the pixel voltage VsigR (FIG. 9(D)).

Subsequently, the drive section 20 performs μ correction while performing writing of the pixel voltage VsigR on the sub-pixel 11R in a period from a timing t5 to a timing t6 (the writing·μ correction period P3). More specifically, the scanning line drive section 23 changes the voltage of the scanning signal WSA from the low level to the high level at the timing t6 (FIG. 9(A)). Accordingly, the writing transistor WSTr of the sub-pixel 11R is turned to the ON state, and the gate voltage Vg of the driving transistor DRTr of the sub-pixel 11R increases from the voltage Vofs to the pixel voltage VsigR (FIG. 9(E)). At this time, the gate-source voltage Vgs of the driving transistor DRTr becomes larger than the threshold voltage Vth (Vgs>Vth), and the current Ids flows from the drain to the source; therefore, the source voltage Vs of the driving transistor DRTr is increased (FIG. 9(F)). By such a negative feedback operation, the influence of device variation of the driving transistor DRTr is reduced (μ correction), and the gate-source voltage Vgs of the driving transistor DRTr is set to a voltage Vemi according to the pixel voltage Vsig. It is to be noted that such a μ correction method is described in, for example, Japanese Unexamined Patent Application Publication No. 2006-215213.

Subsequently, the drive section 20 allows the sub-pixel 11R to emit light in a period from the timing t6 onward (the light emission period P4). More specifically, at the timing t6, the scanning line drive sections 23 changes the voltage of the scanning signal WSA from the high level to the low level (FIG. 9(A)). Accordingly, the writing transistor WSTr of the sub-pixel 11R is turned to the OFF state, and the gate of the driving transistor DRTr of the sub-pixel 11R is turned to a floating state; therefore, a voltage between terminals of the capacitor device Cs, i.e., the gate-source voltage Vgs of the driving transistor DRTr is maintained from this timing onward. Then, as the current Ids flows through the driving transistor DRTr, the source voltage Vs of the driving transistor DRTr increases (FIG. 9(F)), and the gate voltage Vg of the driving transistor DRTr increases accordingly (FIG. 9(E)). Then, when the source voltage Vs of the driving transistor DRTr becomes higher than the sum (Vel+Vcath) of a threshold voltage Vel and the voltage Vcath of the light-emitting device 19, a current flows between the anode and the cathode of the light-emitting device 19 to allow the light-emitting device 19 to emit light. In other words, the source voltage Vs is increased only by an amount according to device variation of the light-emitting device 19 to allow the light-emitting device 19 to emit light.

Subsequently, the data line drive section 27 sets the signal Sig to the pixel voltage VsigW at the timing t7 (FIG. 9(D)).

Subsequently, the drive section 20 performs μ correction while performing writing of the pixel voltage VsigW on the sub-pixel 11W in a period from a timing t8 to a timing t9 (a writing·μ correction period P5). More specifically, the scanning line drive section 23 changes the voltage of the scanning signal WSB from the low level to the high level at the timing t8 (FIG. 9(A)). Thus, in a similar fashion to that in the writing-μ correction period P3, while writing of the pixel voltage VsigW is performed, μ correction is performed.

Subsequently, the drive section 20 allows the sub-pixel 11W to emit fight in a period from the timing t9 onward (a light emission period P6). More specifically, at the timing t9, the scanning line drive section 23 changes the voltage of the scanning signal WSB from the high level to the low level (FIG. 9(B)). Thus, in a similar fashion to that in the light emission period P4, the light-emitting device 19 of the sub-pixel 11W emits fight.

After that, after a lapse of a predetermined period (one frame period), the display unit 1 shifts from the light emission periods P4 and P6 to the writing period P1. The drive section 20 drives the display section 10 to allow the display section 10 to repeat these operations.

(About Luminance in Front Direction and Viewing Angle)

In the display unit 1, a plurality of opening sections are provided in the sub-pixel 11, and the inclined portion PS (reflector) is provided in the insulating layer 213 to enclose each of the opening sections WIN. A function of the inclined portion PS will be described in detail below.

FIG. 10 illustrates an example of a simulation result of light beams around the opening section WIN. FIG. 10 illustrates a state in which light emitted from the light-emitting layer 214 (a bottom side) travels toward the display surface side (a top side). As illustrated in FIG. 10, light is emitted from the light-emitting layer 214 in the opening section WIN to various directions. More specifically, light emitted from the light-emitting layer 214 may travel toward, for example, a direction of the normal to the light-emitting layer 214 (an upper direction in FIG. 10), or a direction deviated from the direction of the normal to the light-emitting layer 214. Some of the light traveling toward the direction deviated from the direction of the normal to the light-emitting layer 214 enters the inclined portion PS of the insulating layer 213, and then is reflected by the inclined portion PS of the insulating layer 213. In other words, as illustrated in FIG. 8, in the inclined portion PS, the insulating layer 213 and the insulating layer 216 that have refractive indices different from each other are adjacent to each other with the light-emitting layer 214 and the cathode 215 in between; therefore, light is reflected by a difference between the refractive indices. Then, the reflected light travels toward the display surface side to be extracted to outside of the display section 10.

Thus, in the display section 10, the inclined portion PS is provided to enclose the opening section WIN; therefore, it is possible to enhance extraction efficiency of light to outside. In other words, for example, in a case where the inclined portion PS is not provided, the light emitted toward the direction deviated from the direction of the normal to the light-emitting layer 214 may be weakened in the display section or may be blocked by the black matrix 219. In this case, a ratio of light extracted to outside of the display section of the light emitted from the light-emitting layer 214 is decreased to decrease light extraction efficiency. On the other hand, in the display section 10, the inclined portion PS is provided, and light is reflected by the inclined portion PS; therefore, it is possible to enhance light extraction efficiency.

Next, a relationship between the height H of the insulating layer 213 in the display section 10, and luminance in a front direction of the display section 10 and a viewing angle will be described below.

FIGS. 11A to 11C illustrate light beams in the opening section WIN, where FIG. 11A illustrates a case where the height H of the insulating layer 213 is high, FIG. 11B illustrates a case where the height H is moderate, and FIG. 11C illustrates a case where the height H is low. In FIGS. 11A to 11C, the size of the opening section WIN, and an inclined angle of the inclined portion PS are equal.

In the case where the height H is high (FIG. 11A), light beams L1 to L4 emitted from the light-emitting layer 214 are reflected by the inclined portion PS by the difference in refractive index between the insulating layer 213 and the insulating layer 216 to travel toward the front direction of the display surface. In other words, in this case, luminance in the front direction of the display unit 1 is increased.

On the other hand, in the case where the height H is moderate (FIG. 11B), the height of the inclined portion PS is reduced; therefore, the light beams L1 and L4 of the light beams L1 to L4 emitted from the light-emitting layer 214 travel in straight lines without entering the inclined portion PS. Moreover, in the case where the height H is low (FIG. 11C), more light beams of the light beams L1 to L4 travel in straight lines without entering the inclined portion PS. In other words, in these cases, compared to the case where the height H is high (FIG. 11A), light beams traveling in straight lines toward the direction deviated from the direction of the normal to the display surface without entering the inclined portion PS are increased in number; therefore, the viewing angle of the display unit 1 is widened.

Thus, in the display section 10, the luminance in the front direction of the display section 10 and the viewing angle are changed according to the height H of the insulating layer 213. At this time, the luminance in the front direction and the viewing angle have a trade-off relationship therebetween. In other words, while it is possible to increase the luminance in the front direction with an increase in the height H, it is possible to widen the viewing angle with a decrease in the height H. Therefore, a balance between the luminance in the front direction of the display section 19 and the viewing angle is allowed to be adjusted by setting of the height H of the insulating layer 213. In order to increase the luminance in the front direction within a range allowing specifications for the viewing angle to be satisfied, for example, the height H and a width of the opening section WIN may be preferably substantially equal to each other.

Moreover, in the display section 10, a plurality of such opening sections WIN are provided; therefore, it is possible to reduce manufacturing cost. In other words, when a plurality of opening sections WIN are provided, the opening sections WIN are downsized; therefore, it is possible to decrease the height H of the insulating layer 213 with consideration of the above-described balance between the luminance in the front direction and the viewing angle. Thus, it is possible to reduce an amount of a material necessary to form the insulating layer 213, and it is possible to reduce time (takt time) necessary to form the insulating layer 213. Thus, in the display section 10, since a plurality of opening portions WIN are provided, it is possible to reduce manufacturing cost.

Further, in the display section 10, a plurality of such opening sections WIN are provided; therefore, it is possible to reduce power consumption. In other words, in the display section 10, compared to a case where one large opening section is provided, an aperture ratio may be decreased by providing a plurality of opening sections WIN; however, even in such a case, luminance of the sub-pixel 11 is allowed to be substantially equal by enhancing light extraction efficiency to outside. More specifically, even if the aperture ratio is reduced by half by providing a plurality of opening sections WIN, luminance of the sub-pixel 11 is allowed to be substantially equal without changing current density in the light-emitting layer 214 by doubling the light extraction efficiency. Thus, it is possible to reduce power consumption by decreasing the aperture ratio while maintaining the current density in the light-emitting layer 214. Moreover, for example, even if the aperture ratio is reduced by half, when the light extraction efficiency is increased more than two-fold, the luminance of the sub-pixel 11 is allowed to be equal while reducing the current density in the light-emitting layer 214. In this case, it is possible to further reduce power consumption. In addition, it is possible to suppress degradation in light emission characteristics with time (so-called burn-in). In other words, in general, the organic EL layer configuring the light-emitting layer 214 is more prone to degradation with time with an increase in current density; therefore, when the current density is decreased in such a manner, degradation with time is less likely to occur, thereby allowing for enhancement of image quality.

Furthermore, in the display section 10, a plurality of opening sections WIN with various shapes are randomly provided in each of the anodes 212; therefore, it is possible to widen the viewing angle. The opening section WIN with an ellipsoidal shape will be described below as an example.

FIGS. 12A and 12B illustrate light beams in the opening section WIN with an ellipsoidal shape, where FIG. 12A illustrates a sectional view in a minor-axis direction of an ellipse, and FIG. 12B illustrates a sectional view in a major-axis direction of the ellipse. In the opening section WIN with the ellipsoidal shape, light beams travel in different ways between the minor-axis direction and the major-axis direction. More specifically, in the minor-axis direction, more light beams are reflected by the inclined portion PS; therefore, the luminance in the front direction of the display section 10 is increased. On the other hand, in the major-axis direction, for example, most of light beams emitted from the vicinity of a center of the opening section WIN travel in straight lines without entering the inclined portion PS. In other words, compared to the case in the minor-axis direction (FIG. 12(A)), in the major-axis direction (FIG. 12(B)), light beams travel in a wider range.

In the display section 10, a plurality of opening sections WIN with various shaped are randomly provided. In other words, for example, as illustrated in FIG. 7, a plurality of opening sections WIN oriented in various directions such as the opening section WIN with an ellipsoidal shape that is long in a vertical direction (a longitudinal direction) and the opening section WIN with an ellipsoidal shape that is long in a horizontal direction (a lateral direction) are provided in each of the anodes 212. Thus, in the display section 10, it is possible to increase the luminance in the front direction of the display section 10, and it is possible to widen viewing angles in various directions.

(About Reflection of Outside Light)

Electronic apparatuses are used under various outside light conditions. More specifically, for example, televisions and monitors of personal computers may be frequently used in an environment where a light bulb, a fluorescent lamp, or the like is turned on, and mobile phones may be frequently used in an environment where the sunlight shines down. Therefore, the display unit applied to these electronic apparatuses is desired to have an easily viewable display screen even in such an outside light environment. In the display section 10, a plurality of opening sections WIN with various shapes are randomly provided in each of the anodes 212; therefore, as will be described below in comparison with a comparative example, it is possible to reduce a possibility that the display screen is less viewable due to reflection of outside light, and it is possible to enhance image quality.

Comparative Example

Next, a display unit 1S according to a comparative example will be described below. In this comparative example, a plurality of opening sections WIN with a square shape are provided in a matrix in each of the anodes 212. Other configurations are similar to those in this embodiment (FIG. 1 and the like).

FIG. 13 illustrates arrangement of the opening sections WIN in a display section 10S according to the comparative example. Thus, in the display section 10S, the opening sections WIN with the square shape are provided in a matrix with an arrangement pitch d in each of the anode 212. In a case where white outside light enters such a display section 10S, diffraction may occur by periodic arrangement of the opening sections WIN, and the outside light may be reflected toward the display surface, thereby causing the possibility that the display screen is less viewable.

FIG. 14 illustrates reflection of outside light LI in the white sub-pixel 11W. In the white sub-pixel 11W, the color filter 218 of white allowing light in a wide wavelength range to pass therethrough is provided on the display surface side; therefore, the outside light LI of white enters the inside of the sub-pixel 11W. In this example, this outside light LI enters at an entry angle $\alpha$. At this time, light components with a wavelength $\lambda$ satisfying the following expression (3) of the outside light LI reinforce each other, and are reflected at a reflection angle $\beta$.

$$n\lambda = d(\sin \alpha - \sin \beta) \tag{3}$$

Herein, n is a degree and is an integer (natural number) of 1 or more. Thus, light with various wavelengths $\lambda$ included in the outside light LI is reflected and dispersed as reflected light LO in different directions according to the wavelengths $\lambda$.

FIG. 15 schematically illustrates dispersion in the sub-pixel 11W of white, and FIG. 16 illustrates an example of a calculation result of the reflection angle $\beta$. The reflected light LO travels over a range of the reflection angle $\beta$ according to the range of the wavelength $\lambda$ of light included in the outside light LI. In FIG. 15, red reflected light LR, green reflected light LG, and blue reflected light LB of the reflected light LO are illustrated. FIG. 16 illustrates a calculation result of the reflection angle $\beta$ under conditions of the arrangement pitch d=10 [µm], the entry angle $\alpha$=45 [deg], the degree n=1 to 3. Herein, the wavelength $\lambda$ of the reflected light LR is 700 [nm], the wavelength $\lambda$ of the reflected light LG is 546.1 [nm], and the wavelength $\lambda$ of the reflected light LB is 435.8 [nm]. It is to be noted that a case where the degree n is 4 or more (n≥4) is not described; however, reflection actually occurs at that degree n. As illustrated in FIGS. 15 and 16, the longer the wavelength $\lambda$ is, the more the reflected angle $\beta$ is decreased, and the larger the degree n is, the more the reflection angle $\beta$ is decreased. Moreover, in consideration of the case of the degree n≥4, light is reflected in a wide range of the reflection angle $\beta$.

On the other hand, in the sub-pixels 11R, 11G, and 11B, the color filters of red (R), green (G), and blue (B) are provided on the display surface side; therefore, only light of these colors included in the outside light LI enters the inside of the sub-pixels 11R, 11G, and 11B, and is diffracted by periodic arrangement of the opening sections WIN to be reflected toward the display surface side. Therefore, dispersion that occurs in the sub-pixel 11W does not occur. However, for example, in the sub-pixel 11R, only red light is reflected toward a specific direction (the reflection angle $\beta$), in the sub-pixel 11G, only green light is reflected toward a specific direction (the reflection angle $\beta$), and in the sub-pixel 11B, only blue light is reflected toward a specific direction (the reflection angle $\beta$).

Accordingly, when a user views the display screen of the display section 10S from a direction of one of various reflection angles $\beta$, the user sees reflected light LO of a color (a wavelength) corresponding to the reflection angle $\beta$. More specifically, for example, when the display screen is viewed from a given direction, the display screen almost entirely appears in blue. Moreover, in a case where the display screen is less viewable in such a manner due to the reflected light LO, for example, in order to avoid such a situation, the user frequently inclines a mobile phone to which such a display section 10S is applied. However, in the display section 10S, since the range of the reflection angle $\beta$ is wide as described above, the reflected light LO of other colors is seen. More specifically, for example, in a case where, in a situation in which the display screen almost entirely appears in blue when viewing the display screen from a given direction, the mobile phone is inclined to avoid the situation, for example, the display screen may almost entirely appear in red this time. In other words, there is a possibility that the user is not allowed to easily avoid a situation in which the display screen is less viewable due to the reflected light LO.

On the other hand, in the display section 10 according to this embodiment, a plurality of opening sections WIN with various shapes are randomly provided in each of the anodes 212. Accordingly, in the display section 10, even if the outside light LI is present, diffraction by the plurality of opening sections WIN is less likely to occur; therefore, it is possible to reduce the possibility that the display screen is less viewable due to the reflected light LO, and it is possible to enhance image quality.

(About Manufacturing Method)

Next, a method of manufacturing the display unit 1 will be described below.

FIG. 17 illustrates a flowchart of the method of manufacturing the display unit 1. In this manufacturing procedure, the light-emitting devices 19, the color filters 218, and the like are formed on the TFT substrate in which devices (the writing transistor WSTr, the driving transistor DRTr, and the capacitor device Cs) other than the light-emitting devices 19 are formed. The method of manufacturing the display unit 1 will be described in detail below.

First, the TFT substrate in which the devices other than the light-emitting device 19 are formed is manufactured (step S1). More specifically, as illustrated in FIG. 4, the gate 201, the insulating layer 202, the polysilicon 203, the insulating layer 204, and the contact/wiring line 205 are formed on the substrate 200 by, for example, photolithography. In manufacturing of this TFT substrate, for example, various known technologies used for manufacturing of liquid crystal display units and the like may be applied.

Subsequently, the insulating layer 211 is formed (step S2). At this time, a contact hole for the contact 205 is formed by patterning with use of photolithography.

Subsequently, the anode 212 is formed by patterning (step S3). At this time, and the anode 212 is connected to the polysilicon 203 through the contact hole and contact 205.

Subsequently, the insulating layer 213 is formed by patterning with use of photolithography (step S4).

FIG. 18 illustrates a mask used when the insulating layer 213 is formed. FIG. 18 illustrates only a portion corresponding to one pixel Pix of the mask. Photolithography is performed to form the insulating layer 213 in a black portion in FIG. 18, that is, to form the opening sections WIN in white portions. In the photolithography, in general, for example, corner portions of the opening section are frequently rounded. Accordingly, each opening section WIN has a rounded shape as illustrated in FIG. 7.

A mask pattern illustrated in FIG. 18 may be formed with use of, for example, a Voronoi diagram in a CAD (Computer Aided Design) tool. In other words, for example, a Voronoi diagram is formed by forming a plurality of generating points and forming a perpendicular bisector of a segment connecting to the respective generating points. At this time, the generating points may be preferably formed to allow areas of respective regions in the Voronoi diagram to be substantially equal to one another. Since the mask pattern is allowed to be formed by a program by forming the mask pattern with use of the Voronoi diagram in such a manner, it is possible to easily design the pattern. It is to be noted that the formation of the pattern is not limited thereto, and, for example, the pattern may be drawn on a CAD tool by a designer.

Subsequently, the light-emitting layer 214 is formed (step S5). The light-emitting layer 214 is formed by evaporating a light emission material that emits light of a color (red, green, blue, or while) corresponding to each of the sub-pixels 11. In the evaporation process, for example, evaporation is performed with use of four respective masks having openings in regions corresponding to the respective anodes 212R, 212G, 212B, and 212W.

Subsequently, the cathode 215 is formed (step S6). The cathode 215 is uniformly formed in the entire display section 10 with use of a so-called area mask in which an opening is formed in a region (area) corresponding to an effective display region of the display section 10.

Subsequently, the insulating layer 216 is uniformly formed in the entire display section 10 (step S7).

Subsequently, the substrate 220 in which the color filter 218, the black matrix 219, and the like are formed is bonded onto the insulating layer 216 formed in the step S7 (step S8). More specifically, for example, first, in vacuum, a seal is formed on one or both of these substrates to enclose, for example, the effective display region, and a resin for bonding is dropped. After that, in vacuum, these substrates are superimposed on each other. After that, the degree of vacuum is decreased to return to atmospheric pressure. Thus, the dropped resin is spread in the sealed region to form the insulating layer 217, thereby bonding these substrates together. It is to be noted that, at this time, pressure may be applied mechanically.

The display unit 1 is allowed to be manufactured by the foregoing flow.

[Effects]

Thus, in this embodiment, since the plurality of opening sections with various shapes are randomly provided, it is possible to reduce a possibility that the display screen is less viewable due to reflection of outside light, and it is possible to enhance image quality.

In this embodiment, since the plurality of opening sections with various shapes are provided, it is possible to widen the viewing angle, and it is possible to enhance image quality.

Modification Example 1-1

In the above-described embodiment, the plurality of opening sections WIN with various shapes are provided in all of four sub-pixels 11R, 11G, 11B, and 11W (the anodes 212R, 212G, 212B, and 212W); however, this embodiment is not limited thereto, and, alternatively, for example, a plurality of opening sections WIN with various shapes may be randomly provided in at least one of the four sub-pixels 11, and predetermined opening sections WIN may be regularly provided in the other sub-pixels 11.

Modification Example 1-2

In the above-described embodiment, the arrangement pattern Pat of the opening sections WIN is the same in all of the sub-pixels 11; however, this embodiment is not limited thereto, and alternatively, for example, as illustrated in FIG. 19, the arrangement pattern Pat may be different in each of the four sub-pixels 11 belonging to one pixel Pix. In this example, in the sub-pixel 11R, the opening sections WIN are provided in an arrangement pattern Pat1, in the sub-pixel 11G, the opening sections WIN are provided in an arrangement pattern Pat2, in the sub-pixel 11W, the opening sections WIN are provided in an arrangement pattern Pat3, and in the sub-pixel 11B, the opening sections WIN are provided in an arrangement pattern Pat4. Herein, in each of the arrangement patterns Pat1 to Pat4, a plurality of opening sections WIN with various shapes are randomly provided. It is to be noted that this modification example is not limited thereto, and alternatively, for example, in at least one of the arrangement patterns Pat1 to Pat4, a plurality of opening sections WIN with various shapes may be randomly provided, and in the other arrangement patterns, for example, predetermined opening sections WIN may be regularly provided.

Modification Example 1-3

In the above-described embodiment, the arrangement pattern Pat of the opening sections WIN is the same in all of the pixels Pix; however, this embodiment is not limited thereto, and alternatively, for example, as illustrated in FIGS. 20 and 21, the arrangement pattern Pat may be different between adjacent pixels Pix. In an example in FIG. 20, in four sub-pixels 11 belonging to a given pixel Pix, the opening sections WIN are provided in the arrangement pattern Pat1, and in four sub-pixels 11 belonging to each of pixels Pix vertically (longitudinally) and horizontally (laterally) adjacent to the given pixel Pix, the opening sections WIN are provided in the arrangement pattern Pat2. Herein, in each of the arrangement patterns Pat1 and Pat2, a plurality of opening sections WIN with various shapes are randomly provided. Moreover, in an example in FIG. 21, in four sub-pixels 11 belonging to a given pixel Pix, as with Modification Example 1-2, the opening sections WIN are provided in the arrangement patterns Pat1 to Pat4, and in four sub-pixels 11 belonging to each of pixels Pix vertically and horizontally adjacent to the given pixel Pix, the opening sections WIN are provided in arrangement patterns Pat5 to Pat8 in a similar fashion. In this case, in each of the arrangement patterns Pat1 to Pat8, a plurality of opening sections WIN with various shapes are randomly provided. As will be described below, such a configuration allows for further reduction in reflection of outside light caused by a pitch (pixel pitch) of the pixel Pix.

FIG. 22 illustrates an example of a calculation result of the reflection angle β in a case where the arrangement pattern Pat is the same in all of the pixels Pix. In this example, the pixel pitch is 60 [µm]. Even in this case, as with the case in FIG. 16, the longer the wavelength λ is, the more the reflection angle β is decreased, and the larger the degree n is, the more the reflection angle β is decreased. It is to be noted that, in this case, the range of the reflection angle β is narrower than that in FIG. 16; therefore, the user may avoid a situation in which the display screen is less viewable due to the reflected light, for example, by inclining the mobile phone. However, the situation in which the display screen is less viewable still remains.

On the other hand, in this modification example, the arrangement pattern Pat of the opening sections WIN is different between adjacent pixels Pix; therefore, it is possible to reduce reflection of outside light caused by the pixel pitch, and it is possible to reduce a possibility that the display screen is less viewable due to the reflected light LO.

Moreover, in the examples in FIGS. 20 and 21, in each of the arrangement patterns Pat1 to Pat8, a plurality of opening sections WIN with various shapes are randomly provided; however, the arrangement patterns Pat1 to Pat8 are not limited thereto. For example, in the example in FIG. 20, in both the arrangement patterns Pat1 and Pat2, predetermined opening sections WIN may be regularly provided. An example in this case is illustrated in FIG. 23. In this example, in each of the anodes 212, a plurality of opening sections WIN with a circular shape are provided in a close packing manner. Then, the size of the opening section WIN is different between vertically (longitudinally) and horizontally (laterally) adjacent pixels Pix. Even in this case, it is possible to reduce reflection of outside light caused by the pixel pitch, and it is possible to reduce the possibility that the display screen is less viewable due to the reflected light LO.

Modification Example 1-4

In the above-described embodiment, the areas of the plurality of opening sections WIN are substantially equal to one another; however, this embodiment is not limited thereto, and alternatively, the areas of the opening sections WIN may be different from one another. In this case, even if the outside light LI is present, diffraction by the plurality of opening sections WIN is less likely to occur; therefore, it is possible to further reduce the possibility that the display screen is less viewable due to the reflected light LO.

Modification Example 1-5

In the above-described embodiment, the plurality of opening sections WIN with various shapes are randomly provided; however, this embodiment is not limited thereto, and alternatively, for example, as illustrated in FIG. 24, the plurality of opening sections WIN with various shapes may be regularly provided in a predetermined pattern. In this example, six opening sections WIN2 with an ellipsoidal shape are provided around an opening section WIN1 with a circular shape to enclose the opening section WIN1. In other words, as with the so-called close packing manner, three of the opening sections WIN1 and WIN2 are provided adjacent to one another. Then, the six opening sections WIN2 with an ellipsoidal shape are provided to be oriented in directions different from one another. Even in a case where the opening sections WIN1 and WIN2 are provided in such a manner, compared to a comparative example, diffraction is less likely to occur; therefore, it is possible to further reduce the possibility that the display screen is less viewable due to the reflected light LO. Moreover, since the opening sections WIN2 with an ellipsoidal shape are oriented in directions different from one another, it is possible to widen the viewing angle.

It is to be noted that, in this example, the opening section WIN1 with a circular shape and the opening sections WIN2 with an ellipsoidal shape are used; however, this modification example is not limited thereto, and opening sections with various shapes as illustrated in FIGS. 25A to 25E may be used. More specifically, for example, the opening sections WIN may have a square shape with rounded corners as illustrated in FIG. 25A, a rectangular shape with rounded corners as illustrated in FIG. 25B, or a shape of a combination of a plurality of ellipses as illustrated in FIGS. 25C to 25E.

Modification Example 1-6

In the above-described embodiment, as illustrated in FIG. 4, the insulating layer 216 is formed on the cathode 215; however, this embodiment is not limited thereto. The insulating layer 216 has a function of preventing change in characteristics such as light emission efficiency caused by entry of moisture into the light-emitting layer 214; however, in a case where various issues caused by the entry of moisture are allowed to be solved by other technologies, as illustrated in FIG. 26, the insulating layer 216 may be omitted. In this example, the cathode 215 is bonded, through an insulating layer 317 as a resin for sealing, onto the substrate 220 with a surface on which the color filter 218 and the black matrix 219 are formed. As with the insulating layers 213 and 216 in the above-described embodiment, the refractive indices of the insulating layers 213 and 317 are set to allow light emitted from the light-emitting layer 214 to be reflected by the inclined portion PS of the insulating layer 213 with which the opening section WIN is enclosed. More specifically, it may be desirable to satisfy the expressions (1) and (2), where the refractive index of the insulating layer 317 is n1 and the reflection index of the insulating layer 213 is n2.

In the above-described embodiment, as illustrated in FIGS. 4 and 5, the light-emitting layers 214 configured to emit red, blue, green, and white light are provided; however, this embodiment is not limited thereto, and as illustrated in FIGS. 27 and 28, a light-emitting layer 320 configured to emit white light may be provided. The light-emitting layer 320 is configured of a yellow light-emitting layer 314 and a blue light-emitting layer 315. In this example, the yellow light-emitting layer 314 is provided closer to the anode 212, and the blue light-emitting layer 315 is provided closer to the cathode 215. The yellow light-emitting layer 314 is an organic EL layer configured to emit yellow light, and the blue light-emitting layer 315 is an organic EL layer configured to emit blue light. Yellow light emitted from the yellow light-emitting layer 314 and the blue light emitted from the blue light-emitting layer 315 are mixed to generate white light. Then, as illustrated in FIG. 28, in the sub-pixels 11R, 11G, and 11B, the white light is separated into a red component, a green component, and a blue component by the color filters of red (R), green (G), and blue (B), respectively, and these components are outputted. Moreover, in the sub-pixel 11W, a color gamut of white light is adjusted by the color filter 218 of white (W). It is to be noted that, in this example, in the light-emitting layer 320, the yellow light-emitting layer 314 is provided closer to the anode 212, and the blue light-emitting layer 315 is provided closer to the cathode 215; however, this modification example is not limited thereto, and alternatively, for example, the yellow light-emitting layer 314 may be provided closer to the cathode 215, and the blue light-emitting layer 315 may be provided closer to the anode 212.

Modification Example 1-8

In the above-described embodiment, the display section 10 in which the sub-pixels 11R, 11G, 11B, and 11W are provided in an array of two rows by two columns in the pixel Pix is used; however, this embodiment is not limited thereto. This modification example will be described in detail below.

FIG. 29 illustrates a configuration example of the display section 30 according to the modification example. Each of the pixels Pix includes four sub-pixels 12 (12R, 12G, 12B, and 12W) of red (R), green (G), blue (B), and white (W). Each of the sub-pixels 12 has a hexagonal shape. In this example, in the pixel Pix, the sub-pixel 12R and the sub-pixel 12W are provided side by side along the vertical direction (longitudinal direction), and the sub-pixel 12G and the sub-pixel 12B are provided side by side along the vertical direction. Moreover, along the vertical direction, the sub-pixels 12R and 12W are provided to be shifted from the sub-pixels 12G and 12B by a half of the sub-pixel 12. More specifically, in the pixel Pix, the sub-pixel 12G is provided at the upper right of the sub-pixel 12R, and the sub-pixel 12B is provided at the upper right of the sub-pixel 12W. In other words, in the display section 30, three sub-pixels 12 are provided adjacent to one another.

FIG. 30 illustrates a configuration example of a display section 40 according to another modification example. Each of the pixels Pix includes three sub-pixels (13R, 13G, and 13B) of red (R), green (G), and blue (B). Each of the sub-pixels 12 has a rectangular shape extending along the vertical direction (longitudinal direction). In this display section 40, the three sub-pixels 13R, 13G, and 13B are provided side by side in this order along the horizontal direction (lateral direction) in the pixel Pix.

Even in such a case, in the anode 212 corresponding to each of the sub-pixels 12 and 13, a plurality of opening sections WIN with various shapes are randomly provided; therefore, it is possible to obtain similar effects to those in the above-described embodiment.

Modification Example 1-9

In the above-described embodiment, photolithography is performed with use of the mask as illustrated in FIG. 18. At this time, photolithography is performed to form the insulating layer 213 in the black portion in FIG. 18, i.e., to form the opening sections WIN in the white portions in FIG. 18. An angle of each vertex in a polygon indicated by white may be desirably large. For example, in a case where the angle is small (for example, 45° or less) as with a mask portion W1 illustrated in FIG. 31A, the light-emitting layer 214 (FIG. 4) is not sufficiently formed around the vertex, and, for example, the anode 212 and the cathode 215 may be short-circuited to decrease luminance. On the other hand, for example, in a case where the angle is increased by increasing the number of vertexes as with a mask portion W2 illustrated in FIG. 31B, it is possible to easily form the light-emitting layer 214, and it is possible to reduce a possibility that luminance is decreased.

Modification Example 1-10

In the above-described embodiment, for example, a plurality of opening sections WIN are randomly provided with use of a pattern using a Voronoi diagram; however, this embodiment is not limited thereto, and alternatively, for example, the plurality of opening sections WIN may be provided in an orderly pattern without periodicity. More specifically, a pattern using a Penrose tiling, a pattern using a Fibonacci spiral, or the like may be used. They will be described in detail below.

FIG. 32 illustrates a pattern using a Penrose tiling. FIG. 32 illustrates an example of a mask in a given sub-pixel 11, and photolithography is performed to form the opening section WIN in a white portion. As well known, the Penrose tiling is a tiling in which a plurality of rhombuses of two kinds are spread without gap. In this example, in each of regions of these rhombuses, a portion that is to serve as the opening section WIN is provided. In FIG. 32, in a case where there is a possibility that luminance is decreased due to a small angle of a vertex, for example, as with a mask portion W3 illustrated in FIG. 33A, it is possible to increase the angle of the vertex by increasing the number of vertexes. Moreover, for example, as illustrated in FIG. 33B, the number of portions that are to serve as the opening sections WIN may be decreased, and the portions that are to serve as the opening sections WIN may be provided to straddle the regions of a plurality of rhombuses adjacent to each other. Thus, it is possible to enhance flexibility in design, and it is possible to increase the angle of the vertex.

FIG. 34 illustrates a pattern using a Fibonacci spiral, and FIG. 35 illustrates the Fibonacci spiral. As well known, the Fibonacci spiral is drawn, based on the Fibonacci sequence. The pattern illustrated in FIG. 34 uses a pattern of a part of the Fibonacci spiral illustrated in FIG. 35. The pattern using the Fibonacci spiral is not limited to the pattern illustrated in FIG. 34, and may use a pattern of any portion of the Fibonacci spiral illustrated in FIG. 35.

The orderly pattern without periodicity is not limited thereto. For example, as illustrated in FIG. 36, a pattern in which pentagons are spread without gap (a pentagon tiling) may be adopted. In this example, four sides of five sides in each of the pentagons have an equal length. In this example, a portion that is to serve as the opening section WIN is provided in each of regions of these pentagons. It is possible to increase the angle of each vertex by such a configuration.

Moreover, for example, a pattern based on an atomic arrangement seen in a paracrystal may be used. Unlike crystal, the paracrystal does not have translation symmetry; however, the paracyrstal has order in atomic arrangement. As a material having the atomic arrangement of the paracrystal, for example, an aluminum-palladium-manganese (Al—Pd—Mn) alloy may be known. It is possible to achieve the orderly pattern without periodicity by providing the opening sections WIN in a similar fashion to the atomic arrangement of such a paracrystal.

Thus, even if the plurality of opening sections WIN are provided in the orderly pattern without periodicity, as with the case of the above-described embodiment, it is possible to reduce the possibility that the display screen is less viewable due to reflection of outside light, and it is possible to enhance image quality.

Other Modification Examples

The present disclosure is not limited to the above-described embodiment and the above-described modification examples, and alternatively, for example, two or more of the above-described embodiment and the above-described modification examples may be combined.

2. Second Embodiment

Next, a display unit 2 according to a second embodiment will be described below. In this embodiment, there is included a display section 50 in which a smaller number of opening sections WIN3 than that in other sub-pixels 11R, 11G, and 11B are provided in the white sub-pixel 11W. Other configurations are similar to those in the above-described first embodiment (FIG. 1 and the like). It is to be noted that like components are denoted by like numerals as of the display unit according to the above-described first embodiment, and will not be further described.

FIG. 37 schematically illustrates arrangement of the opening sections WIN in the display section 50. In each of the anodes 212R, 212G, and 212B, a plurality of opening sections WIN with various shapes are randomly provided in a similar fashion to that in the display section 10 according to the above-described embodiment. On the other hand, in this example, in the anode 212W, one large opening section WIN3 is provided.

In the display section 50, this configuration allows diffraction of the outside light LI to be less likely to occur in the sub-pixel 11W of white (W), and it is possible to reduce the possibility that the display screen is less viewable due to the reflected light LO. In other words, in the sub-pixel 11W of white (W), the color filter 218 of white allowing light in a wide wavelength range to pass therethrough is formed; therefore, the outside light LI of white enters the inside of the sub-pixel 11W. Accordingly, in a case where diffraction occurs in this sub-pixel 11W, as illustrated in the comparative example of the above-described first embodiment, light is reflected in a wide range of the reflection angle β; therefore, there is a possibility that the display section is less viewable due to the reflected light LO. On the other hand, in the display section 50, a single opening section WIN3 is formed in the sub-pixel 11W of white (W); therefore, it is possible to reduce a possibility that diffraction occurs. Therefore, it is possible to reduce the possibility that the display screen is less viewable due to the reflected light, thereby enhancing image quality.

Thus, in this embodiment, a single opening section is provided in the white sub-pixel; therefore, it is possible to reduce the possibility that the display screen is less viewable due to reflection of outside light, thereby enhancing image quality.

Modification Example 2-1

In the above-described embodiment, the single opening section WIN3 is provided in the white sub-pixel 11W (the anode 212W); however, this embodiment is not limited thereto, and alternatively, for example, as illustrated in FIG. 38, a plurality of opening sections WIN3 that is smaller in number than the opening sections in the other sub-pixels 11R, 11G, and 11B (the anode 212R, 212G, and 212B) may be provided. At this time, in order to increase the aperture ratio, areas of the respective opening sections WIN3 may be desirably large.

Modification Example 2-2

In the above-described embodiment, a plurality of opening sections WIN with various shapes are randomly provided in each of the anodes 212R, 212G, and 212B; however, this embodiment is not limited thereto, and alternatively, for example, as illustrated in FIG. 39A, in these anodes 212R, 212G, and 212B, predetermined opening sections WIN may be regularly provided.

Moreover, in this case, as illustrated in FIGS. 39B to 39D, a smaller number of opening sections WIN3 with the same size as that of the opening section WIN provided in the anodes 212R, 212G, and 212B may be provided in the anode 212W. More specifically, for example, as illustrated in FIG. 39B, the opening sections WIN3 may be provided with a wide pitch in the anode 212W, as illustrated in FIG. 39C, the opening sections WIN3 may be provided with a small pitch in a part of the anode 212W, or as illustrated in FIG. 39D, the opening sections WIN3 may be randomly provided in the anode 212W.

3. Application Examples

Next, application examples of the display units described in the above-described embodiments and the above-described modification examples will be described below.

FIG. 40 illustrates an appearance of a television to which one of the display units according to the above-described embodiments and the like is applied. The television may include, for example, an image display screen section 510 including a front panel 511 and a filter glass 512, and the image display screen section 510 is configured of one of the display units according to the above-described embodiments and the like.

The display units according to the above-described embodiments and the like are applicable to not only such a television but also electronic apparatuses in any fields such as digital cameras, notebook personal computers, mobile terminal units such as mobile phones, portable game machines, and video cameras. In other words, the display units according to the above-described embodiments and the like are applicable to electronic apparatuses, in any fields, that display an image.

Although the present technology is described referring to some embodiments, some modification examples, and some application examples to electronic apparatuses, the present technology is not limited thereto, and may be variously modified.

For example, in the above-described embodiments and the like, each of the writing transistor WSTr and the driving transistor DRTr is configured of an NMOS; however, these transistors are not limited thereto, and one or both of these transistor may be configured of a PMOS instead of the NMOS.

Moreover, for example, in the above-described embodiments and the like, the sub-pixel has a so-called "2Tr1C" configuration; however, the sub-pixel is not limited thereto, and the sub-pixel may further include another device. More specifically, as with a sub-pixel 14A illustrated in FIG. 41, the sub-pixel may have a so-called "2Tr2C" configuration by providing a capacitor device Csub connected in parallel to the light-emitting device 19. Further, for example, as with a sub-pixel 14B illustrated in FIG. 42, the sub-pixel may have a so-called "3Tr1C" configuration by providing a power supply transistor DSTr that is configured to control supply of the power supply signal DS to the driving transistor DRTr.

Furthermore, for example, in the above-described embodiments and the like, a so-called top emission light-emitting device 19 is used; however, the light-emitting device 19 is not limited thereto, and instead of this, for example, a so-called bottom emission light-emitting device in which light emitted from the light-emitting layer 214 travels toward a direction of the substrate 200 serving as a supporting substrate may be used.

In addition, for example, in the above-described embodiments and the like, the display unit includes the organic EL display device; however, the display unit is not limited thereto, and any display unit including a current-driven display device may be adopted.

It is to be noted that the present technology may have following configurations.

(1) A display unit including:
a pixel including a plurality of sub-pixels, each of the sub-pixels including a single first electrode, a single second electrode provided along a laminating direction of the first electrode, and a light-emitting layer inserted between the first electrode and the second electrode,
in which one or more of the plurality of sub-pixels have a plurality of light emission regions including two or more light emission regions different in one or more of shape, size, and orientation from one another.

(2) The display unit according to (1), in which
the sub-pixel including the plurality of light emission regions includes
a first insulating layer formed on the first electrode and including opening sections in positions corresponding to the respective light emission regions, and
a second insulating layer with a different refractive index from a refractive index of the first insulating layer, the second insulating layer formed on the second electrode, and
the first electrode, the light-emitting layer, the second electrode, the second insulating layer are laminated in order on a bottom of the opening section.

(3) The display unit according to (1) or (2), in which each of the plurality of sub-pixels includes the plurality of light emission regions.

(4) The display unit according to (3), in which the plurality of light emission regions are provided in a same arrangement pattern in the plurality of sub-pixels.

(5) The display unit according to (3), in which the plurality of light emission regions are provided in an arrangement pattern that is different between the plurality of sub-pixels.

(6) The display unit according to (4) or (5), including a plurality of pixels each being the pixel, in which
the arrangement patterns of the mutually-corresponding sub-pixels in the adjacent pixels are the same as each other.

(7) The display unit according to (4) or (5), including a plurality of pixels each being the pixel, in which
the arrangement patterns of the mutually-corresponding sub-pixels in the adjacent pixels are different from each other.

(8) The display unit according to any one of (3) to (7), in which the plurality of sub-pixels include a first sub-pixel, a second sub-pixel, a third sub-pixel, and a fourth sub-pixel, the first to third sub-pixels each configured to emit basic color light, and the fourth sub-pixel configured to emit non-basic color light.

(9) The display unit according to (8), in which the light emission regions in the fourth sub-pixel are smaller in number than those in the other sub-pixels.

(10) The display unit according to any one of (3) to (7), in which the plurality of sub-pixels include a first sub-pixel, a second sub-pixel, and a third sub-pixel each of which is configured to emit basic color light.

(11) The display unit according to (1) or (2), in which
the plurality of sub-pixels include a first sub-pixel, a second sub-pixel, a third sub-pixel, and a fourth sub-pixel, the first to third sub-pixels each configured to emit basic color light, and the fourth sub-pixel configured to emit non-basic color light,
each of the first sub-pixel, the second sub-pixel, and the third sub-pixel includes a plurality of light emission regions, and
the fourth sub-pixel includes a single light emission region.

(12) The display unit according to any one of (1) to (11), in which light emission regions adjacent to each other of the plurality of light emission regions are different in one or more of shape, size, and orientation from each other.

(13) The display unit according to any one of (1) to (12), in which the plurality of light emission regions are provided in an arrangement pattern based on a Voronoi diagram.

(14) The display unit according to any one of (1) to (12), in which the plurality of light emission regions are provided in an orderly arrangement pattern without periodicity.

(15) The display unit according to (14), in which the arrangement pattern is based on a Penrose tiling.

(16) The display unit according to (14), in which the arrangement pattern is based on a Fibonacci spiral.

(17) The display unit according to (14), in which the arrangement pattern is based on a pattern in which pentagons are spread without gap.

(18) The display unit according to (14), in which the arrangement pattern is based on an atomic arrangement of a paracrystal.

(19) The display unit according to any one of (1) to (12), in which each of shapes of the plurality of light emission regions is a circular shape or an ellipsoidal shape.

(20) The display unit according to (19), in which three light emission regions of the plurality of light emission regions are provided adjacent to one another.

(21) An electronic apparatus provided with a display unit and a control section configured to perform operation control on the display unit, the display unit including:
a pixel including a plurality of sub-pixels, each of the sub-pixels including a single first electrode, a single second electrode provided along a laminating direction of the first electrode, and a light-emitting layer inserted between the first electrode and the second electrode,
in which one or more of the plurality of sub-pixels have a plurality of light emission regions including two or more light emission regions different in one or more of shape, size, and orientation from one another.

The present application contains subject matter related to that disclosed in Japanese Priority Patent Application JP 2013-112074 filed in the Japan Patent Office on May 28, 2013 and Japanese Priority Patent Application JP 2013-225534 filed in the Japan Patent Office on Oct. 30, 2013, the entire contents of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display unit, comprising:
a first pixel of a plurality of pixels, wherein
the first pixel includes a plurality of sub-pixels, and
each of the plurality of sub-pixels includes:
a first electrode;
a second electrode along a laminating direction of the first electrode;
a light-emitting layer between the first electrode and the second electrode;
a first insulating layer on the first electrode;
a plurality of windows on the first electrode, wherein
the plurality of windows includes at least a first window and a second window,
a first shape of the first window is different from a second shape of the second window,
a width of the first window and a height of the first insulating layer are same,
the width of the first window is in a first direction parallel to the light-emitting layer, and
the height of the first insulating layer is in a second direction perpendicular to the light-emitting layer; and
a color filter,
wherein the plurality of windows overlaps with the color filter.

2. The display unit according to claim 1, wherein
the first insulating layer includes a plurality of opening sections in positions corresponding to the plurality of windows,
at least one of the plurality of sub-pixels further includes a second insulating layer on the second electrode,
a first refractive index of the first insulating layer is different from a second refractive index of the second insulating layer, and
the first electrode, the light-emitting layer, the second electrode, and the second insulating layer are laminated on a bottom of the plurality of opening sections.

3. The display unit according to claim 1, wherein a first arrangement pattern of the plurality of windows is same in each sub-pixel of the plurality of sub-pixels.

4. The display unit according to claim 3, wherein arrangement patterns of mutually-corresponding sub-pixels in adjacent pixels of the plurality of pixels are the same as each other.

5. The display unit according to claim 3, further comprising a second pixel of the plurality of pixels, wherein
the second pixel is adjacent to the first pixel, and
the first arrangement pattern of the plurality of windows of a first sub-pixel in the first pixel is different from a second arrangement pattern of a plurality of windows of a mutually-corresponding sub-pixel in the second pixel.

6. The display unit according to claim 1, wherein an arrangement pattern of the plurality of windows is different in each sub-pixel of the plurality of sub-pixels.

7. The display unit according to claim 1, wherein
the plurality of sub-pixels includes a first sub-pixel, a second sub-pixel, a third sub-pixel, and a fourth sub-pixel,
the first sub-pixel, the second sub-pixel, and the third sub-pixel are configured to emit basic color light, and
the fourth sub-pixel is configured to emit non-basic color light.

8. The display unit according to claim 7, wherein the plurality of windows in the fourth sub-pixel is smaller in number than the plurality of windows in the first sub-pixel, the second sub-pixel, and the third sub-pixel.

9. The display unit according to claim 1, wherein the plurality of sub-pixels includes a first sub-pixel, a second sub-pixel, and a third sub-pixel each of which is configured to emit basic color light.

10. The display unit according to claim 1, wherein
the first window is adjacent to the second window, and
the first window is different from the second window in at least one of a size or an orientation.

11. The display unit according to claim 1, wherein an arrangement pattern of the plurality of windows is based on a Voronoi diagram.

12. The display unit according to claim 1, wherein the plurality of windows is in an orderly arrangement pattern without periodicity.

13. The display unit according to claim 12, wherein the orderly arrangement pattern is based on a Penrose tiling.

14. The display unit according to claim 12, wherein the orderly arrangement pattern is based on a Fibonacci spiral.

15. The display unit according to claim 12, wherein the orderly arrangement pattern is based on a pattern in which pentagons are spread without gap.

16. The display unit according to claim 12, wherein the orderly arrangement pattern is based on an atomic arrangement of a paracrystal.

17. The display unit according to claim 1, wherein
a first size of the first window is different from a second size of the second window,
a first orientation of the first window is different from a second orientation of the second window, and
the plurality of windows corresponds to light emission regions of each of the plurality of sub-pixels.

18. The display unit according to claim 1, wherein a luminance of the display unit and a viewing angle of the display unit are based on the width of the first window and the height of the first insulating layer, respectively.

19. An electronic apparatus, comprising:
a display unit; and
a control section configured to control the display unit, wherein the display unit comprises:
a pixel including a plurality of sub-pixels, wherein each of the plurality of sub-pixels includes:
a first electrode;
a second electrode along a laminating direction of the first electrode;
a light-emitting layer between the first electrode and the second electrode;
a protrusion on the first electrode in a cross-sectional view, wherein
the protrusion comprises an insulating material, and
the light-emitting layer is in contact with the protrusion;
a light-emitting area adjacent to the protrusion; and
a color filter, wherein
the protrusion and the light-emitting area overlap with the color filter,
an edge of the light-emitting area includes a curved shape in a plan view, and
the light-emitting area includes a non-symmetrical shape in the plan view.

20. The electronic apparatus according to claim 19, wherein at least two light-emitting areas are on the first electrode.

21. A display unit, comprising:
a first pixel of a plurality of pixels, wherein
the first pixel includes a plurality of sub-pixels, and
each of the plurality of sub-pixels includes:
an anode;
a cathode along a laminating direction of the anode;
a light-emitting layer between the anode and the cathode;
an insulating layer on the anode;
a plurality of windows on the anode, wherein
the plurality of windows includes at least a first window and a second window,
a first shape of the first window is different from a second shape of the second window,
a width of the first window and a height of the insulating layer are same,
the width of the first window is in a first direction parallel to the light-emitting layer, and
the height of the insulating layer is in a second direction perpendicular to the light-emitting layer; and
a color filter,
wherein the plurality of windows overlaps with the color filter.

* * * * *